(12) United States Patent
O'Brien et al.

(10) Patent No.: US 10,804,038 B2
(45) Date of Patent: Oct. 13, 2020

(54) ELECTRICAL COMPONENTS AND CIRCUITS INCLUDING SAID COMPONENTS

(75) Inventors: Benjamin Marc O'Brien, Auckland (NZ); Iain Alexander Anderson, Auckland (NZ); Thomas Gregory McKay, Auckland (NZ); Emilio Patricio Calius, Auckland (NZ)

(73) Assignee: Auckland UniServices Limited, Auckland (NZ)

( * ) Notice: Subject to any disclaimer, the term of this patent is extended or adjusted under 35 U.S.C. 154(b) by 165 days.

(21) Appl. No.: 13/581,285

(22) PCT Filed: Feb. 18, 2011

(86) PCT No.: PCT/NZ2011/000026
§ 371 (c)(1),
(2), (4) Date: Jan. 7, 2013

(87) PCT Pub. No.: WO2011/105913
PCT Pub. Date: Sep. 1, 2011

(65) Prior Publication Data
US 2013/0100575 A1    Apr. 25, 2013

(30) Foreign Application Priority Data

Feb. 24, 2010 (NZ) ........................... 583525
Dec. 10, 2010 (NZ) ........................... 589868

(51) Int. Cl.
*H01G 5/00* (2006.01)
*H02N 2/18* (2006.01)
*H01L 41/04* (2006.01)

(52) U.S. Cl.
CPC ............. *H01G 5/00* (2013.01); *H01L 41/042* (2013.01); *H02N 2/181* (2013.01)

(58) Field of Classification Search
CPC ...... H01G 5/00; H01G 5/0138; H01G 5/0136; H01G 5/0134; H01G 5/0132; H01G 5/013; H01L 41/042
See application file for complete search history.

(56) References Cited

U.S. PATENT DOCUMENTS 4,322,983 A * 4/1982 Sado .................... H01C 10/106
                                                        338/114
4,738,146 A    4/1988 Baumgartner
(Continued)

FOREIGN PATENT DOCUMENTS

EP      0 442 015 A1    8/1991
GB        925048 A       5/1963
(Continued)

OTHER PUBLICATIONS

Extended European Search Report dated Apr. 3, 2014, issued in corresponding European Application No. 11747773.7, filed Sep. 21, 2012, 5 pages.
(Continued)

*Primary Examiner* — David M Sinclair
(74) *Attorney, Agent, or Firm* — Christensen O'Connor Johnson Kindness PLLC

(57) ABSTRACT

The invention provides an electric circuit device including a conductive element configured to provide an electrical input to an electrical component, the resistivity of the conductive element being variable based at least on the extent of deformation thereof, and a deformable body coupled directly or indirectly to, or integral with, the conductive element such that deformation of the body causes the conductive element to deform, thereby varying the resistance thereof and altering the input to the electrical component. Said devices may be used singularly or in combination as logic elements within electrical circuits, providing drive (Continued)

and/or control functionality. Particular embodiments provide improved electrostatic generators.

45 Claims, 13 Drawing Sheets

(56) References Cited

U.S. PATENT DOCUMENTS

| | | | | |
|---|---|---|---|---|
| 4,852,443 | A * | 8/1989 | Duncan | G10H 1/0551 |
| | | | | 200/600 |
| 4,876,419 | A * | 10/1989 | Lodini | H01H 3/141 |
| | | | | 200/86 R |
| 4,900,497 | A * | 2/1990 | Lodini | H01C 10/106 |
| | | | | 264/104 |
| 5,867,302 | A * | 2/1999 | Fleming | B81B 3/0054 |
| | | | | 310/328 |
| 5,886,615 | A | 3/1999 | Burgess | |
| 5,962,118 | A * | 10/1999 | Burgess | H01H 1/029 |
| | | | | 252/503 |
| 6,543,299 | B2 * | 4/2003 | Taylor | G01L 1/205 |
| | | | | 73/862.046 |
| 6,646,540 | B1 * | 11/2003 | Lussey | H01C 10/106 |
| | | | | 338/114 |
| 6,768,246 | B2 | 7/2004 | Pelrine | |
| 7,392,716 | B2 | 7/2008 | Wilner | |
| 8,638,024 | B2 * | 1/2014 | Anderson | H01L 41/0986 |
| | | | | 310/323.02 |
| 2002/0175594 | A1 * | 11/2002 | Kornbluh | B60G 17/01941 |
| | | | | 310/317 |
| 2003/0067245 | A1 * | 4/2003 | Pelrine | A43B 3/0005 |
| | | | | 310/311 |
| 2005/0039949 | A1 * | 2/2005 | Kosowsky | C25D 5/54 |
| | | | | 174/262 |
| 2007/0148788 | A1 | 6/2007 | Hsieh | |
| 2008/0212262 | A1 | 9/2008 | Micallef | |
| 2008/0218132 | A1 | 9/2008 | Pelrine | |
| 2009/0242855 | A1 * | 10/2009 | Fleming | H01B 1/22 |
| | | | | 252/519.34 |
| 2009/0278815 | A1 * | 11/2009 | Li | G06F 3/045 |
| | | | | 345/174 |
| 2012/0299514 | A1 | 11/2012 | Anderson | |

FOREIGN PATENT DOCUMENTS

| | | | |
|---|---|---|---|
| GB | 950937 | A | 2/1964 |
| JP | 2008113544 | A | 5/2008 |
| JP | 2009273201 | A | 11/2009 |
| WO | 20001079546 | A1 | 12/2000 |
| WO | 20061121818 | A2 | 11/2006 |
| WO | 20091015151 | A1 | 1/2009 |
| WO | WO 2009108072 | A1 * | 9/2009 ......... H01L 41/0986 |
| WO | 20111005123 | A1 | 1/2011 |

OTHER PUBLICATIONS

Office Action dated Dec. 25, 2014, issued in related Japanese Application No. 2012-554959, filed Feb. 18, 2011, 5 pages.
McKay, T., et al., "An Integrated, Self-Priming Dielectric Elastomer Generator," Applied Physics Letters 97(6):062911-1-062911-2, Aug. 2010.
Prahlad, H., et al., "Polymer Power: Dielectric Elastomers and Their Applications in Distributed Actuation and Power Generation," Proceedings of the 4th ISSS International Conference on Smart Materials, Structures and Systems, Bangalore, India, Jul. 28-30, 2005, pp. SA-100-SA-107.
International Search Report dated May 31, 2011, issued in corresponding International Application No. PCT/NZ2011/000026, filed Feb. 18, 2011, 6 pages.
Written Opinion dated May 31, 2011, issued in corresponding International Application No. PCT/NZ2011/000026, filed Feb. 18, 2011, 10 pages.
International Preliminary Report on Patentability dated May 30, 2012, issued in corresponding International Application No. PCT/NZ2011/000026, filed Feb. 18, 2011, 14 pages.

* cited by examiner

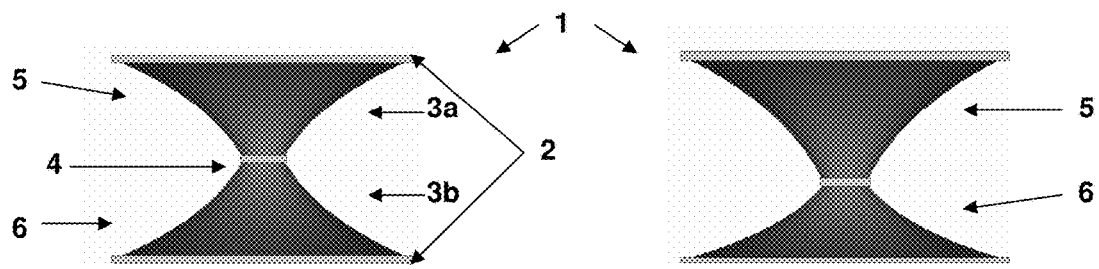
FIGURE 1A FIGURE 1B
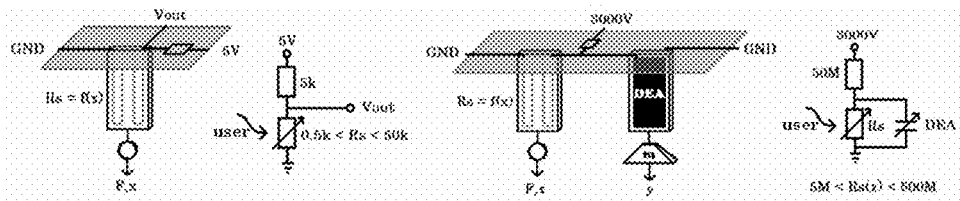
FIG 2A  FIG 2B  FIG 2C  FIG 2D
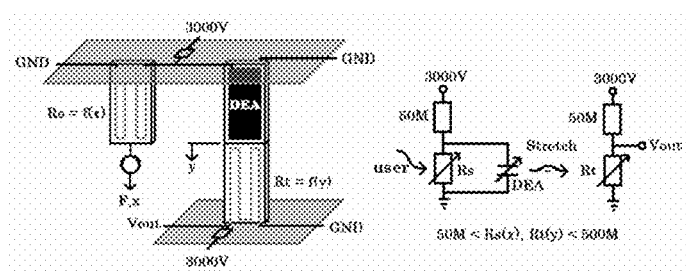
FIG 3A  FIG 3B
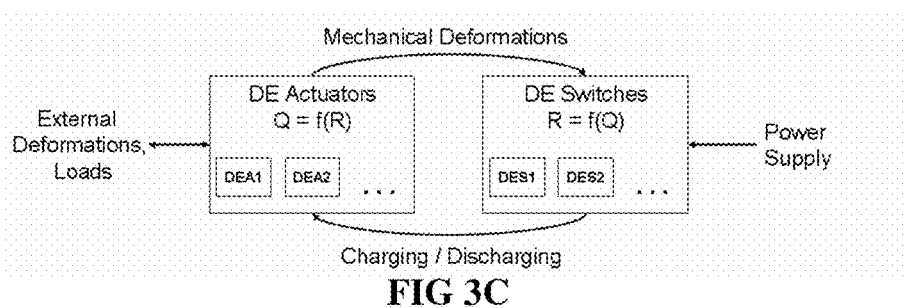
FIG 3C

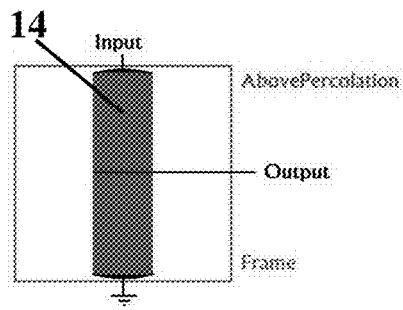
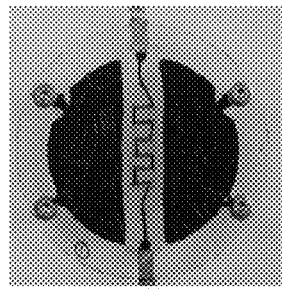
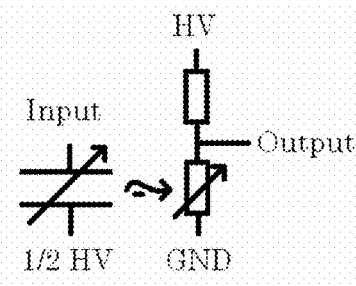
FIG 27A     FIG 27B     FIG 27C
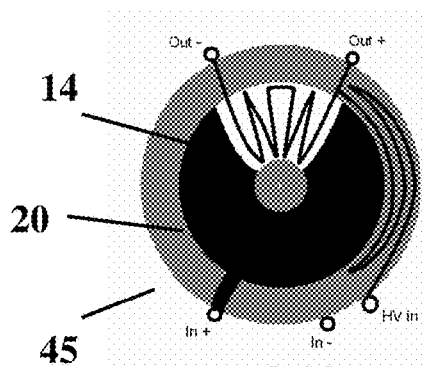
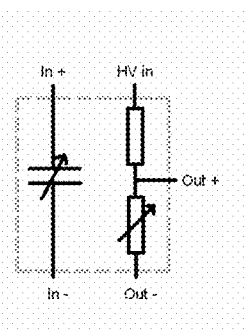
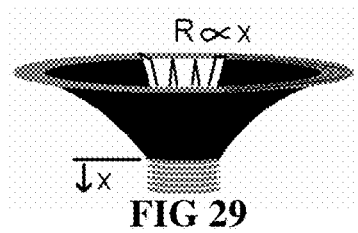
FIG 28     FIG 29
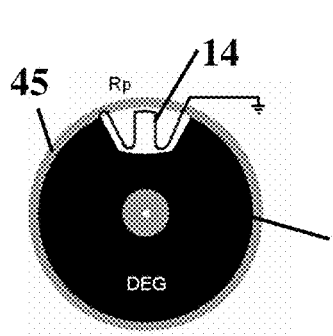
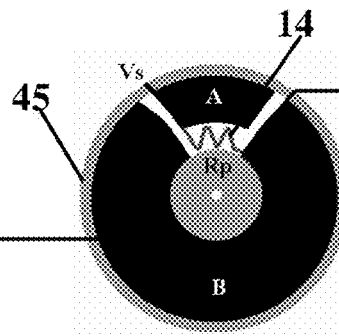
FIG 30     FIG 31
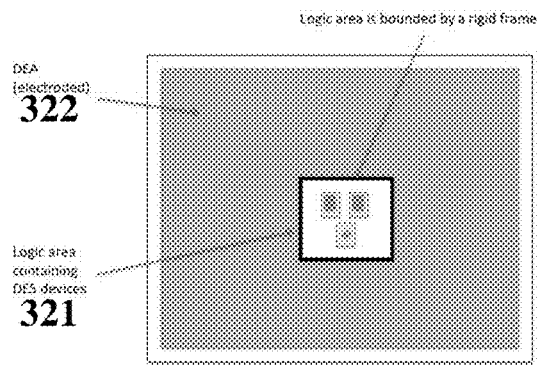
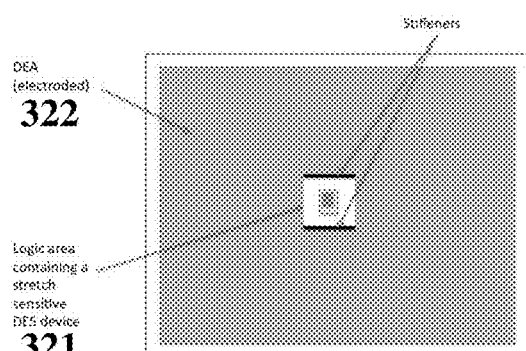
FIG 32A     FIG 32B

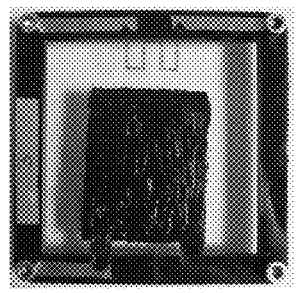
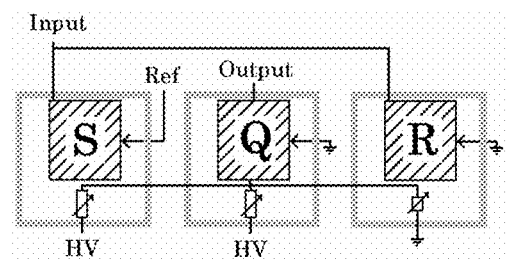
FIG 33A    FIG 33B
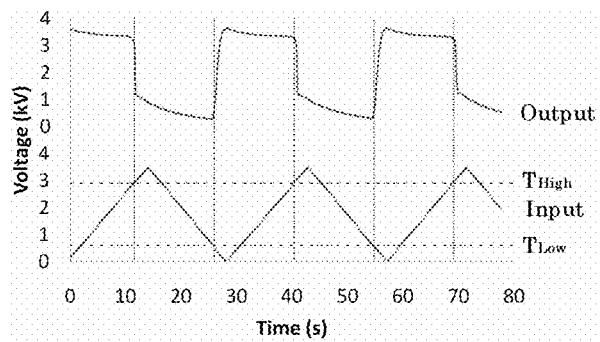
FIG 33C
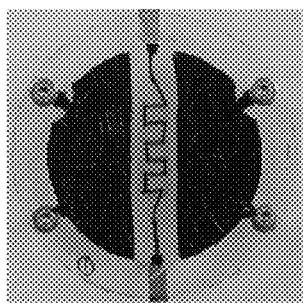
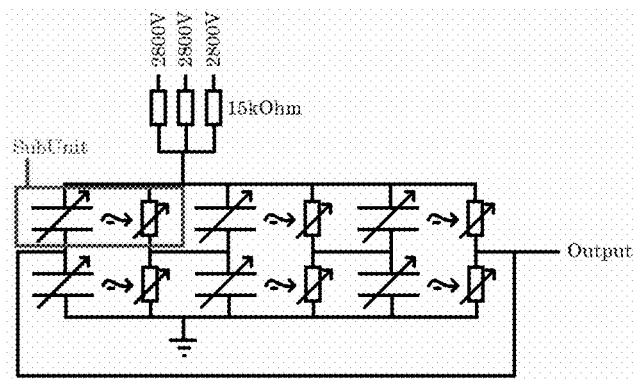
FIG 34A    FIG 34B
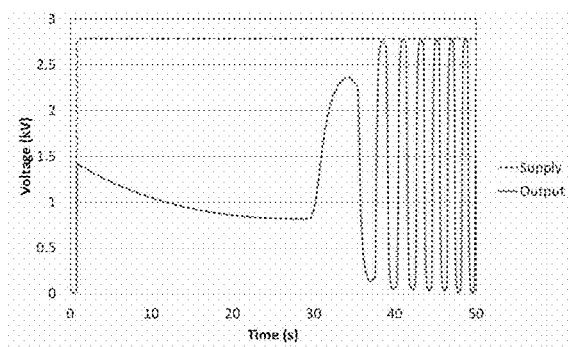
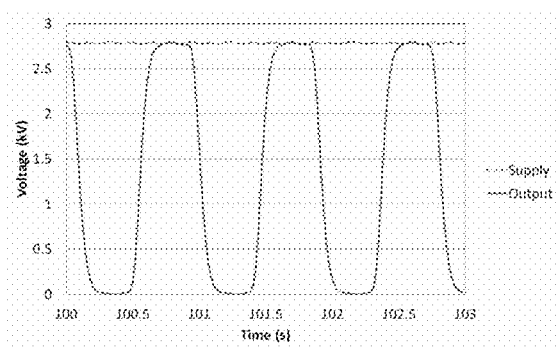
FIG 34C    FIG 34D

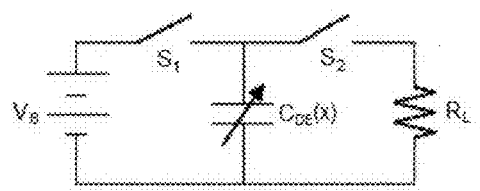 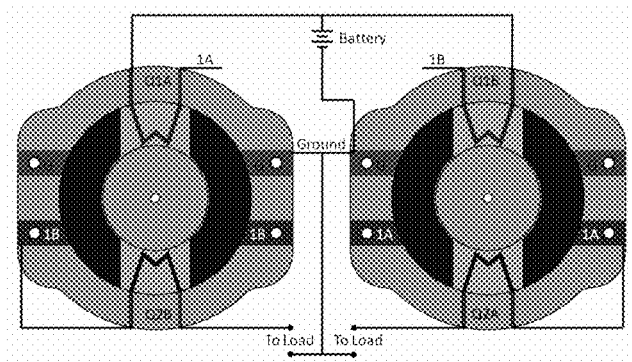
FIG 37A　　　　　　　　FIG 37B
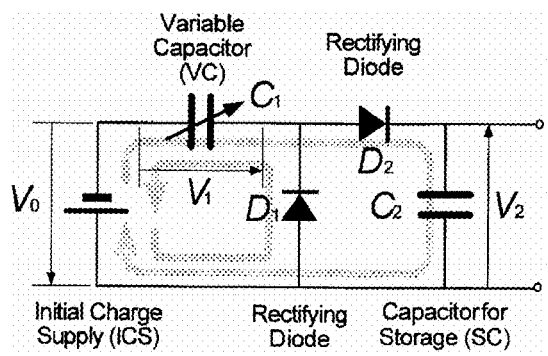
FIG 38A
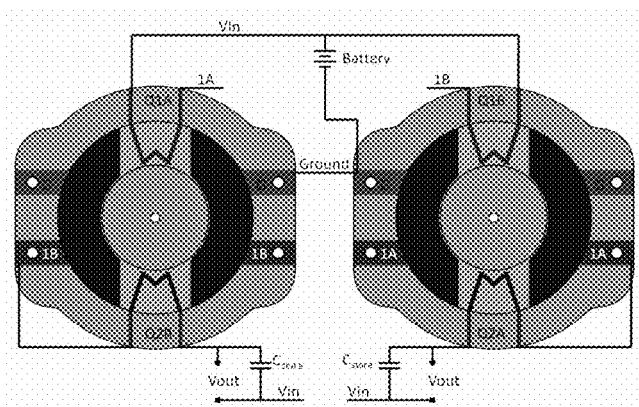 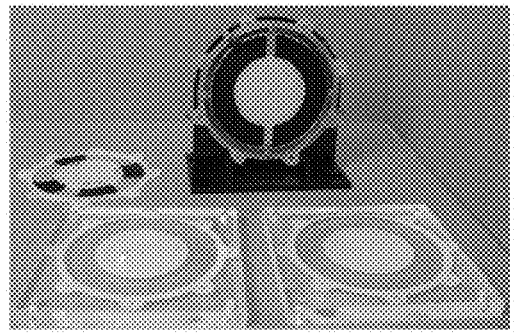
FIG 38B　　　　　　　　FIG 39

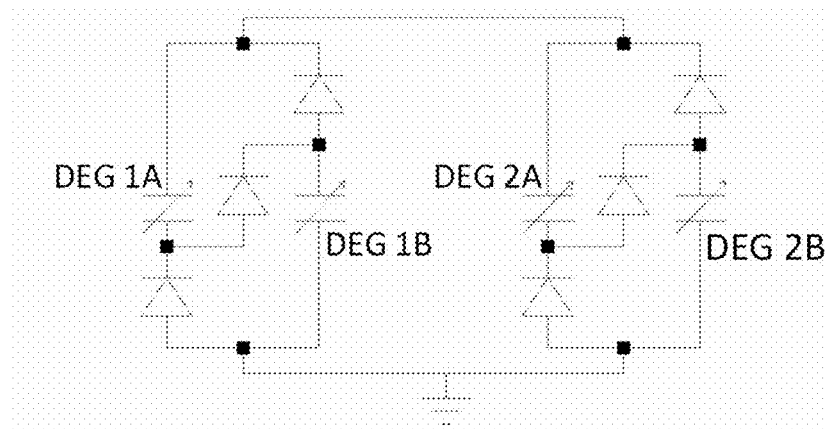
FIG 40A
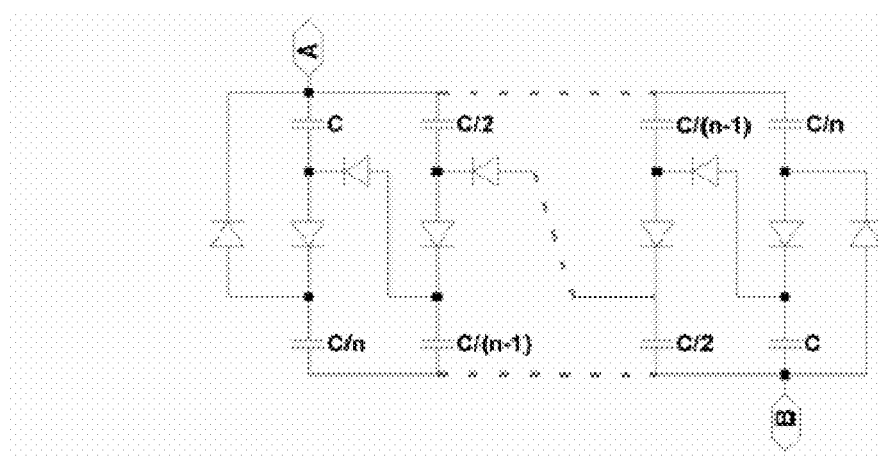
FIG 40B
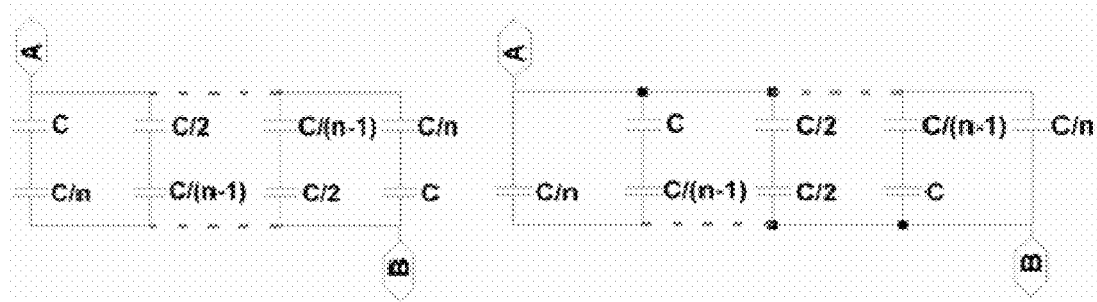
FIG 40C            FIG 40D

ELECTRICAL COMPONENTS AND CIRCUITS INCLUDING SAID COMPONENTS

FIELD OF INVENTION

The invention relates to electrical circuits. Particular embodiments provide electrical components or circuit devices having multi-functionality, such as the ability to act as an actuator as well as driving or otherwise controlling another component. Other embodiments provide means and methods for configuring and/or controlling a generator, namely a dielectric elastomer generator (DEG), and/or circuits containing a generator. The invention further relates to the resultant generator and/or circuits.

BACKGROUND

Smart, distributed actuator systems are common in nature. For example, the human heart is essentially a large network of actuators coordinated via a distributed control strategy employing electro-chemo-mechano-feedback loops at every level of the structure. Such systems have been difficult to mimic in artificial devices, at least without complicated and costly control circuitry.

Dielectric Elastomer Devices (DEDs) operate as flexible capacitors. They may be formed from a dielectric elastomer sandwiched between compliant electrodes. When the capacitor is charged by applying a voltage across the electrodes, electrostatic forces give rise to a thickness contraction and planar expansion. Appropriate design enables a desired deformation to be achieved, which in turn enables DEDs to be used as actuators, referred to herein as DEAs (Dielectric Elastomer Actuators).

The electrostatic forces are termed the Maxwell stress and can be written as an equivalent pressure acting in the thickness direction:

$$P_{Maxwell} = \varepsilon_o \varepsilon_r \frac{V^2}{t^2}$$

where $\varepsilon_o$ and $\varepsilon_r$ are the absolute and relative permittivities of the dielectric respectively, V is the applied voltage, and t is the dielectric thickness.

DEDs can therefore be controlled by varying the voltage applied across the electrodes, or the total charge allowed into the system (which is related to the voltage through the capacitance).

DEDs can also work in a generator mode. If a DED is deformed after it has been charged, the work done on the charges results in a change in the separation of charges, generating electrical energy. By monitoring the capacitance or resistance of the device it can also act as a sensor.

The different modes of operation are realised using specialised external circuitry, specifically, actuator modes are typically controlled with microprocessors coupled to high voltage switches, and sensor modes require isolation, conditioning and interpretation circuitry.

Dielectric elastomer generator (DEG) arrangements have been described in WO 2011/005123, assigned to the assignee of the present invention and incorporated herein by reference. FIGS. 1A and 1B show an example electrical transformer 1 arrangement which includes rigid frame 2 and two sheets 3a, 3b of dielectric elastomer material joined by a substantially rigid member 4. The sheets 3 of preferably pre-stretched dielectric elastomer are provided with electrodes on the surfaces thereof.

In FIGS. 1A and 1B, upper sheet 3a forms part of a DEA 5 and lower sheet 3b part of a DEG 6. Actuation of DEA 5 (by application of a voltage across its electrodes) causes the sheet 3a to deform, which in turn causes the sheet 3b of the DEG 6 to deform.

The DEA and DEG may be configured to be substantially identical, resulting in substantially the same input and output voltages. Alternatively, the DEA and DEG may be configured to produce a desired transformation, such as a gain in voltage. To achieve this, different properties of the DEG may be varied compared to the DEA to produce the voltage gain, including: surface area; thickness or number of layers; type of dielectric elastomer material; degree of pre-stretching. Alternatively, the voltage change may be adjusted by altering the frequency and/or magnitude of the voltage waveform input to the system.

As opposed to mechanically coupling the DEDs to provide an electrical transformer, an electrical coupling may be used to provide a mechanical transformer such that deformation of one dielectric elastomer body causes another to deform in a predetermined manner. Arrangements of this type are also described in WO 2011/005123. For example, a mechanical transformer may include two individual DEGs each consisting of a sheet of dielectric elastomer stretched between an inner member and an outer annular frame member, the inner member being common between the two DEGs. With the outer annular frame members maintained at a predetermined distance from one another in a passive state, the inner member is positioned between the outer annular frame members with the elastomer sheets stretched therebetween. Electrodes are situated on the upper and lower surfaces of each of the elastomer sheets. In use, an oscillatory force provided to the inner member causes one of the DEGs to be stretched and the other to be relaxed, thereby creating electrical energy by altering the spacing between the electrodes. To generate electrical power, the electrodes of a DEG must first be charged or primed so that charge is present and deformation of the dielectric elastomer alters the spacing between the charges. An energy reservoir (e.g. a battery) may be permanently connected to the DEG to supply the bias voltage, the DEG then effectively increasing the amount of energy the battery can supply. Alternatively, a capacitor bank may be used whereby a portion of the energy generated by a DEG is stored for future use in supplying the bias voltage. In a theoretical system with no losses, the total amount of charge in the system remains constant and it is transferred to the DEG which increases its energy and then returns it back to the charge reservoir.

In reality, no circuit components are ideal and therefore charge is lost from the system. To overcome this, WO 2011/005123 describes converting an increase in voltage into an increase in charge. Effectively, a reverse charge pump was used so that electrical energy was converted to a lower voltage, higher charge form.

FIG. 18A is a diagram of a circuit 30 including a DEG 31 and a self-priming circuit (S-P C) 32. DEG 31 is connected in parallel with S-P C 32 and a load 33. DEG 31 can be viewed as equivalent to a variable capacitor (VC) 34 with a resistor ($R_{leak}$) 35 in parallel through which VC 34 loses charge. The charge leakage 35 increases with voltage across DEG 31.

FIG. 18B shows an example self-priming circuit 32 which may be used in the arrangement of FIG. 18A. The circuit 32 includes two capacitors of capacitance C and three diodes arranged as illustrated. When the capacitor bank supplies a priming voltage to a DEG, current flows from node B to node A. When current flows in this direction, because of the diodes, the capacitors are effectively arranged in parallel as far as current flow is concerned, meaning the energy is in a high charge, low voltage form. To transfer energy back from the DEG to the capacitor bank, current flows in the direction of node A to node B with the capacitors effectively in series, meaning the energy is in a high voltage, low charge form. One characteristic of the circuit of FIG. 18B is that the proportional change in voltage produced by the DEG needs to be higher than the proportional change in the voltage across the capacitor bank when it changes from the parallel state to the series state. In the embodiment of FIG. 18B with the two capacitors having the same capacitance, the voltage needs to double for the system to self prime. Alternative circuit layouts may be used to reduce the required voltage increase. For example, the circuit of FIG. 18C requires the voltage to increase by only 50% for the system to self prime.

In FIG. 18C, the leftmost circuit schematically shows the actual configuration, the middle circuit shows the effective layout of the leftmost circuit when current flows from node B to node A (with the capacitor bank supplying the DEG) and the right circuit shows the effective circuit when current flows from node A to node B (when energy is transferred back to the capacitor bank).

While such arrangements perform the self-priming function, there are issues with them, at least for certain applications. The requirement for diodes and/or more conventional capacitors means that external circuitry must be provided to facilitate the functionality. The requirement for external circuitry increases system bulk, mass, rigidity, cost, and complexity, restricting possible applications.

DEG priming circuits, require a source of charge for priming the DEG. This source has been required to supply high voltage charge. Self-priming circuits such as those described in WO 2011/005123 reduce the required initial voltage and have the ability to operate without permanent connection to an external source. However an initial voltage is still required.

DEDs provide a promising avenue for creating biomimetic, smart, distributed actuator systems. However, their successful application has thus far been limited, largely due to the need for external sensing, control and driver circuitry that does not scale well with array size. This also adds to the weight, cost and size of such devices, assuming that issues with integrating the circuitry into a DED can be overcome.

It is an object to provide systems and/or apparatus and/or methods that at least ameliorate one/more of these problems. Alternatively, it is an object to provide improved means and methods for configuring and/or controlling a DED and/or circuits containing a DED. Alternatively, it is an object to provide an improved DED and/or a circuit containing a DED. Alternatively, it is an object to at least provide the public with a useful choice.

SUMMARY OF THE INVENTION

In broad terms, particular aspects of the invention provide what is referred to herein as a "Dielectric Elastomer Switch" (DES). DES rely on the large piezoresistance of dielectric elastomer electrodes to switch other devices (e.g. to charge/discharge a DEA). This provides a means of sensing and control that can eliminate external circuitry, reducing cost, weight, volume and complexity of the system by orders of magnitude. Ultimately the DES concept allows the creation of smart devices, particularly dielectric elastomer actuator and/or generator devices.

Piezoresistivity is the variation of resistivity when a material is deformed. Piezoresistivity in dielectric elastomer devices can be achieved using a composite of conductive particles in a non-conductive matrix. As the electrode stretches the density of conducting particles changes, and due to percolation, the resistivity may change by orders of magnitude. This can occur because the material transitions from a state where there exists a complete path of conducting particles from one side of the electrode material to the other to a state where there is not. More particularly, for distributed conducting particles on a non-conducting surface, there is a critical density called the percolation threshold above which a conducting path exists from one side to the other, and below which there is no path. Strong piezoresistivity arises when the material is stretched so that the density passes through the percolation threshold.

DEDs can be usefully configured as deformation sensors by applying a voltage and measuring the changing current as the electrode material stretches, effectively providing a self-sensing function, monitoring the mechanical state of the DED. The invention goes beyond this, using the piezoresistive properties of DEDs not only to provide a sensing function, but to enable the DED to provide an output to another device, preferably directly, such that it, for example, acts as a driver circuit in addition to acting as a sensor. In short, it is this functionality that is generally used herein to distinguish a DES from other DEDs.

FIGS. 2A and 2B show use of a DED as a sensor. The arrangement includes a deformable electrode (shown as a variable resistor in FIG. 2B) incorporated into a voltage divider. As the electrode stretches, its resistance changes, thereby changing the output voltage as some function of electrode stretch. More particularly, a strip of elastomer material is fixed to a support at one end and has a pull ring at the other. A user pulls on the ring which stretches the switching material and causes its resistance to rise sharply from say 500 Ohms at rest to say 50 kOhms at maximum extension. The switching material is configured to sit in a voltage divider with a 5 kOhm fixed resistance and a 5 V supply. Thus as the material is stretched the output voltage Vout will change from 0.45 V to 4.54 V. This provides a piezoresistive displacement sensor whereby displacement of the ring by a distance x varies the resistance of the sensor element as a function of x, the voltage divider being used to interrogate the circuit to provide the sensed output.

FIGS. 2C and 2D illustrate a simple arrangement which uses a DES as both a sensor and a DEA driver circuit. The same pull-ring setup as in FIG. 2A is used with the addition of a DEA (shown as a variable capacitor in FIG. 2D) provided for lifting a mass. The output from the sensor circuit is coupled directly to the DEA so that when the user pulls the ring the voltage across the DES and DEA will increase, causing the actuator to expand, lowering the mass. For the DES element to act as a driver in this way its electrical characteristics must be different from those of the above sensor circuit of FIGS. 2A and 2B. DEAs are high voltage, low current devices so the DES must withstand thousands of volts while switching currents on the order of 0.1-1 mA. For this reason, a piezoresistive element which switches between 5 and 500 MOhm and a fixed resistor of 50 MOhm are used in the voltage divider. These values could change if the DEA were scaled up or down or had different speed requirements.

FIGS. 3A and 3B take this further, showing how DES can form logic circuitry. At the heart of this concept is the idea that information can flow either electrically or mechanically. The DES elements can charge or discharge DEA electrically, and the DEA elements can deform the DES mechanically. The DES/DEA circuit of FIGS. 3A and 3B acts as an inverter. In this circuit the weight has been removed and replaced with a second DES element, Rt. The DEA element and Rt are in tension so that if the DEA actuates then Rt will shrink, lowering its resistance. Rt is connected into a second voltage divider that outputs a voltage, which could be used to drive another DEA. The device functions when the user pulls the ring, which drives the activation of the DEA shown. The DEA expands causing Rt to shrink and the output voltage Vout to drop. Thus Vout changes are inverted with respect to voltage changes applied to the DEA.

The two-way DEA/DES interaction is shown more generally in FIG. 3C. The DEAs control the resistance R of the DESs via deformation and the DESs control the charge Q on the DEAs via their changing resistance. The functions Q=f (R) and R=f (Q) are determined by the device design.

Preferred aspects of the invention are set forth in the independent claims with preferred embodiments provided in the dependent claims.

"Electric circuit device" is to be interpreted broadly as a device which can be electrically coupled to a circuit and/or otherwise used to affect the current and/or voltage of an electrical circuit. As used throughout the specification, the term includes within its scope devices that may generate some form of motion in response to application of a voltage and/or be used to affect the electrical properties of a circuit in response to a deformation force. The deformation force may be generated by applying a voltage to an actuator or control means therefor or may be provided in any other way, such as through interaction with a user.

"Electrical component" is to be interpreted broadly as a device or element or apparatus requiring or in some way responsive to an electrical input. According to particular embodiments, the component is or is formed from one or more DEDs.

"Conductive element" or "track" is to be interpreted broadly as one or more conductive tracks, elements or particles that operate in series or in parallel to transfer current but which are responsive to a deformation force to become in some way reconfigured, the resistance of the track or element varying as a result thereof. The element or track may be formed on or in the body, or otherwise coupled thereto. While said element is formed from a conducting material, it essentially acts as a resistor, more particularly, a variable resistor. The reconfiguring may be a deformation and/or may involve one or more deformable or substantially rigid constituent elements moving relative to one another, said movement causing a change in resistance.

Particular embodiments of the invention are set out below.

According to a first particular embodiment, there is provided an electric circuit device including:

a conductive element configured to provide an electrical input to an electrical component, the resistivity of the conductive element being variable in response to a deformation force; and a deformable body coupled directly or indirectly to, or integral therewith, the conductive element such that deformation of the body causes the resistance of the conductive element to vary and alters the input to the electrical component.

Preferably, the resistivity is variable based at least on an extent of deformation of the conductive element.

Preferably, the body is deformable in response to the application of a voltage thereto or thereacross.

According to preferred embodiments, the body is formed from a dielectric elastomer provided with at least first and second electrodes coupled or integral thereto, such that application of a voltage to the electrodes causes the body to deform. The electrodes are preferably provided on opposing surfaces of the body. Further, the electrodes are preferably deformable, in particular, in response to deformation of the body.

The body and/or electrodes may be configured as required to generate a desired deformation. Multiple bodies may be included, as required, and/or separate active areas may be defined across a particular body (by configuration of the electrodes) such that different deformations may be generated, as required. Each deformation may affect the same or a different conductive track. In the case of different conductive tracks, these may or not be electrically coupled in some way.

Furthermore, since dielectric elastomers may readily be formed as thin membranes, they may be easily stacked one above the other. While each layer may be configured as a separate device according to the first aspect, various elements may be common. For example, a common electrode may be provided between two adjacent layers. Also, the same or different inputs may be receivable. A benefit of receiving a common input across multiple stacked, substantially parallel bodies is that the resultant deformation generates a stronger force, provided each body is configured to deform in a similar manner.

The invention is not limited to the use of membrane-type dielectric elastomer bodies. The configuration used can be tailored to a particular environment within which it is to be used.

While some preferred embodiments may use a dielectric elastomer body under tension (i.e., stretched and fixed to a frame element), the invention is not limited thereto. Again, configurations can be selected based on the required operation characteristics.

Preferably, the second electrode is electrically coupled to the conductive element.

The dielectric elastomer provided with suitably configured electrodes essentially acts as a capacitor. According to particular embodiments, the mechanical deformation of the capacitor (DEA) is used to control the current from a power source to the electrical component via the conductive element. More particularly, as the DEA deforms, the conductive element deforms, changing its resistivity and altering the current output by the conductive element. The output current can be used to control and/or vary a drive signal provided to the electrical component. Intermediate circuitry (such as control or drive circuitry) may be provided.

Alternatively, the conductive element may be coupled to a separate electrical power supply, but with deformation of the body still affecting the signal output by the conductive element.

According to one embodiment, the device is configured to operate as a NOT gate. According to a preferred version of this embodiment, the device is configured such that application of a voltage across the body expands the body and compresses the conductive element, such that the resistivity of the conductive element falls. Consequently, a high input to the body results in a low voltage across the conductive element (i.e., a digital input of 1→digital output of 0).

According to another embodiment, the device is configured to operate as an AND gate. According to a preferred version of this embodiment, the device includes first and second said deformable bodies, each body having a respective electrical input. Each body is configured to deform a portion of the conductive element or to deform respective conductive elements coupled in series. In this arrangement, both bodies are required to deform to generate a high voltage output (i.e., 1+1→1, all other combinations of inputs result in a zero output). Additional bodies and respective conductive elements may be provided to configure the device to accommodate additional inputs, all required to be high to generate a high output.

According to another embodiment, the device is configured as a voltage clamp. According to a preferred version of this embodiment, the conductive element is deformed by and receives its input signal from the body, or at least the electrodes thereof.

According to another embodiment, the device is configured as a diode. According to a preferred version of this embodiment, the device includes first and second bodies. As discussed above, these may be configured as separate areas within the same body. In this embodiment, one end of the conductive track is electrically coupled to the first body and a first input, and the second end is electrically coupled to the second body and a second input. While both bodies will deform at the same time, the deformation of the conductive track varies depending on whether the first or second input has a higher potential, More particularly, the device is configured such that a greater expansion of the first body causes the resistance to decrease and a greater expansion of the second body causes the resistance of the conductive track to increase.

According to another embodiment, the device is configured as a summing junction. According to a preferred version of this embodiment, the device includes a plurality of deformable bodies, each having a separate input. The output generated by this device is in effect a sum of the inputs, in that each body deforms the conductive track (directly or indirectly) to some degree, with the overall deformation (and therefore change in resistance) being a function of the sum of the individual displacements.

According to another embodiment, there is provided a neuron. Preferably, this arrangement includes the aforementioned summing junction and further includes one or more additional bodies to which weighting inputs are applied.

According to another embodiment, the device is configured as a latch. Preferably, this arrangement includes first, second and third deformable bodies (which may be defined by separate electroded areas on the same body), each body being configured to deform a respective conductive element but electrically coupled in parallel to a single said body (the first body). Two of said elements are coupled to a high voltage input and the other to ground. The device is configured such that actuation of the second body deforms a conductive element coupled to a high voltage input, thereby reducing the resistance. Due to the configuration of the device, the first body actuates and remains actuated unless the third body is actuated.

According to another embodiment, the device is configured as a buffer. Preferably, this arrangement includes first and second conductive tracks, each being located between and deformable by a respective first and second DEAs. The first DEAs receive a first input and the second DEAs are coupled to an output. Control of this arrangement is effected depending on whether the input or the output has a higher voltage. The conductive tracks are coupled together and to the output. They are configured such that, for any input/output voltage combination, the effect on each track is substantially the opposite thereof (i.e., if the resistance of one track rises, the other lowers). The result of this arrangement is that the output voltage remains substantially the same as the input voltage despite changing current demands.

According to another embodiment, the device is configured as an operational amplifier (opamp). One particular configuration is substantially the same as that disclosed immediately above for a buffer and only differences will be described. Namely, the couplings between the output and the second DEAs are removed and relative deformation is dependent on the difference between an input voltage applied to the first DEAs and an input voltage applied to the second DEAs.

According to another embodiment, the device is configured as a frequency multiplier. Preferably, this arrangement includes a DEA and a DES resistance ladder configured such that expansion of the DEA due to application of a voltage to an input terminal coupled to the DEA causes a ratio of resistances formed by the ladder to vary. According to an alternative arrangement, a DES is integrated with a DEA. More particularly, a first, input terminal and a second, grounded terminal are provided on the DEA. They are spaced apart with an output terminal positioned therebetween. The arrangement is configured such that the electrode for the first terminal acts as a DES, again enabling frequency multiplication.

According to one embodiment, the conductive element includes at least first and second constituent elements, the constituent elements being relatively displaceable in response to deformation of the body, said displacement affecting the overall resistance of the conductive element. For example, the conductive element may include a plurality of intersticed constituent elements whereby deformation of the body changes the extent of overlap of one subset of the elements connected to an input and one subset of the elements connected to an output, each subset including one or more of the elements.

Preferably, the electrical component is a second electric circuit device according to the first aspect of the invention. The second device may or may not be configured in the same way as the first device.

One or more components of the first device may be integral with or common to components of the second device.

As will be appreciated, multiple deformable objects placed in close association may have an undesirable or unwanted impact on adjacent devices, at least on particular sides of any given device. Consequently, devices of the invention, or components thereof, may be shielded from deformation from one or more directions. Such deformation could be effected by outside forces or other devices/components of the invention.

According to one embodiment, one or more substantially rigid frame members may be provided around a device of the invention, or at least a portion thereof. The frame members may be provided on one or more sides of the device or portion thereof, thereby isolating the device from deformations of adjacent device, or at least limiting to only deformations from a particular direction or directions having an effect.

The frame members may simply comprise additional layering of the material used to form the body, and consequently may not be substantially rigid, simply more rigid or less prone to deformation than another portion of the body.

According to an alternative embodiment, as opposed to the use of frame elements, one or more devices or portions thereof may be reinforced such as through the layering of additional material. This additional material may be of the same or a different type to the body.

As will be appreciated, one or more devices of the invention may be incorporated within a DED which may itself include a bounded type membrane (as discussed below). Thus, embodiments of the invention may include a bounded membrane within a bounded membrane.

The device of the first particular embodiment may be or form part of an electrostatic generator, wherein:

the deformable body has a capacitance dependent at least in part on an extent of deformation thereof; and the body and the element are configured such that:

when the body is deformed in a first manner, the resistance of the element changes and results in additional electrical energy being stored by the body, and when the body is deformed in a second manner, the resistance of the element changes in a different manner and results in electrical energy being drawn away from the body.

The deformation in a first manner preferably results in an increase in at least a first dimension of the body and a decrease in a second dimension.

Preferably, deformation in the second manner results in a decrease in the first dimension of the body and an increase in the second dimension.

Preferably, the body is a first body and the element is a first element, wherein the electrostatic generator includes a second conductive element, configured in a similar manner to the first conductive element. The resistance of the second element may be configured to change to match the resistance of the first element (or at least vary in a corresponding manner) or otherwise. For example, the resistance of the second element may increase while that of the first element decreases.

Preferably, the electrostatic generator includes a second deformable body. The second body may deform in substantially the same or in a corresponding manner when the first body deforms, or it may deform differently. For example, the first body may increase in dimension in a first direction while the second body decreases in the same direction.

According to a preferred embodiment, the first body includes first and second electroded zones electrically coupled via first and second said elements coupled to or integral with the first body. Preferably a second said body is provided with first and second electroded zones with a third said element coupled to or integral to the second body. Preferably, the third element is electrically coupled to the electroded zones of the first body. According to this arrangement, preferably the first and second bodies are mechanically coupled such that expansion of one body in a first direction causes the other to become smaller in that direction.

Preferably, expansion of the first body in a first direction causes the resistance of the first and second elements to increase and/or the resistance of the third element to decrease.

Preferably, reduction in size of the first body in the first direction (or another direction) causes the resistance of the first and second elements to decrease and/or the resistance of the third element to increase.

Through appropriate electrical connection of the electrodes and elements, the generator of embodiments of the invention effectively provides two interchangeable circuits, the first circuit being effective (or relatively more effective) as a result of a first deformation and the second effective (or more effective) as a result of a second deformation. Switching between the circuits is used to control whether further charge is stored in the system (such as to overcome inherent losses in the system) or whether charge may be diverted to a load.

As with all embodiments, rather than being separate electrode zones of the same dielectric elastomer body, the electrode zones may be formed from separate dielectric elastomer bodies.

Thus the invention provides a DEG having no requirement for external circuitry to provide control of the basic operation thereof. Since control is effected by the flexible elements and the bodies themselves are flexible, the overall generator may be configured to be flexible, removing system design constraints of other generators.

According to one embodiment, the generator forms part of a hybrid generator and further includes an auxiliary generator, the auxiliary generator being configured to provide an initial priming charge to the electrostatic (preferably DEG) generator.

The auxiliary generator may be of any form but is preferably integrated within the electrostatic generator. Consequently, the auxiliary generator may be configured to be flexible, making it able to generally conform to the configuration of the body of the DEG as it deforms. The auxiliary generator may use PVDF, flexible solar cells, or dielectric paper. Alternatively, generator technology such as a piezoelectric, electromagnetic, other solar or other transducer technology may be used.

The invention further provides a transformer including such an electrostatic generator and/or said hybrid generator.

Corresponding methods of power generation and/or energy transformation are also provided, along with use of said generator and/or said transformer.

The invention also provides methods of manufacturing a generator and/or a transformer.

According to a second particular embodiment, there is provided an apparatus including a first electric circuit device according to the first particular embodiment structurally and/or electrically coupled to a second electric circuit device according to the first particular embodiment, said coupling being direct or indirect.

According to one embodiment, the apparatus is configured for use in or as an electric motor. According to this embodiment, while not limited thereto, the apparatus includes first, second and third electric circuit devices according to the first aspect. Preferably, the second electric device is the respective electrical component of the first device; the third electric device is the respective electrical component of the second device; and the first electric device is the respective electrical component of the third device.

According to another embodiment, there is provided a mechanosensitive cilia array wherein the first electric device includes first and second deformable bodies, each body having first and second electrodes, preferably disposed on opposing sides thereof. On a first side, the electrodes are coupled to one another and the conductive track. Furthermore, they are configured to couple to a preferably similarly adjacently positioned second electric device, but on the other, second side thereof, the second side being similarly configured but coupled to a high voltage power supply. Preferably, the conductive track on each side is positioned between the bodies (or the electrodes of the same body). If the first device is deformed, it actuates, pushing on the adjacent device, and in turn actuates that device. As will be apparent, an array of such devices can be configured to generate a desired chain of movement.

According to a third particular embodiment, there is provided a method of driving and/or controlling an electrical component, the method including:

deforming a body having a conductive element associated therewith, said deformation causing the resistivity of the conductive element to change based at least on the extent of deformation thereof and altering the input to the electrical component.

Other features of the method are analogous to features of the apparatus, as defined in the first and second particular embodiments. The same applies to method as claimed.

Further particular embodiments provide any one or more of, singularly or in any combination thereof, an AND gate, a NOT gate, a NAND gate, a diode, a neuron, a voltage clamp, a mechanosensitive cilia array, a low current driver, a motor (particularly a rotary motor), a latch, a buffer, an opamp, or a frequency multiplier, each substantially being formed from and/or including one or more DEDs.

Preferably, at least some element of control or drive is effected by a DES.

The invention further provides a logic element for a circuit including a DED, more particularly a DES.

The invention further provides a logic circuit including one or more said logic elements operatively coupled together.

The invention further provides a computing device including one or more of said logic elements and/or said logic circuits.

The invention further provides a dielectric elastomer membrane or otherwise shaped body having one or more boundary members coupled thereto or more preferably, formed integrally therewith. The boundary members may be in the form of a frame (being substantially linear in the case of a membrane or have a two or three dimensional configuration, particularly for non-planar bodies) and/or a region of increased thickness of material and serve to at least partially isolate the body from external deformation forces, or at least reduce the impact thereof. For example, the boundary members may shield the body from deformation from one or more directions so as to restrict and/or inhibit the deformation of at least a portion of a deformable body.

The boundary members may be formed from the same or a different material from the dielectric elastomer.

The invention further provides a method of making a dielectric elastomer membrane or body including forming one or more boundary members on or within dielectric elastomer material.

Preferably, the material is in the form of a sheet.

Preferably, the method includes separating or detaching a portion of the material.

Preferably, the portion is then used as or in the forming of a DED.

More particularly, the method relates to a method of forming a DED including said dielectric elastomer membrane or body.

Further aspects of the invention, which should be considered in all its novel aspects, will become apparent to those skilled in the art upon reading of the following description which provides at least one example of a practical application of the invention.

BRIEF DESCRIPTION OF THE DRAWINGS

Embodiments of the invention will now be described, by way of example only, with reference to the accompanying drawings in which:

FIGS. 1A-B are side views of an electrical transformer;

FIGS. 2A-B are schematic and circuit diagrams of a DED arrangement for a sensor;

FIGS. 2C-D are schematic and circuit diagrams of a DED arrangement providing sensing and driver functionality;

FIGS. 3A-B are schematic and circuit diagrams of a DED arrangement providing logic functionality;

FIG. 3C is a schematic diagram of the interaction between DESs and DEAs;

FIG. 27A illustrates an alternative embodiment of a frequency multiplier;

FIGS. 27B-C provide schematic and circuit diagrams of another embodiment of a frequency multiplier;

FIGS. 28-32B illustrate further embodiments of the invention;

FIGS. 33A-C illustrate a setup, circuit and results for an inverting Schmitt trigger;

FIGS. 34A-B show a ring oscillator;

FIGS. 34C-D show results obtained from the arrangement of FIGS. 34A-B;

FIG. 37A shows a mechanical switch-based self-priming arrangement;

FIG. 37B shows an equivalent arrangement to FIG. 37A of another embodiment;

FIG. 38A shows an electrostatic generator arrangement;

FIG. 38B is an equivalent arrangement to FIG. 38A of another embodiment;

FIG. 39 shows arrangements used to test the working of particular embodiments;

FIG. 40A schematically shows an alternative to the embodiment of FIG. 35B; and

FIGS. 40B-D schematically show alternative self-priming circuits.

DETAILED DESCRIPTION OF PREFERRED EMBODIMENTS

As previously discussed, FIGS. 2C and 2D illustrate a simple example arrangement embodying the invention, whereby piezoresistivity is used by a DES to control a small dielectric elastomer actuator holding a mass. Such an arrangement may be used, for example, as a remote actuation device. A user pulls on the ring stretching the piezoresistive element, labelled Rs, causing the resistance to climb rapidly from, say 20 MΩ to 500 MΩ. Electrically, the switching resistor Rs is the discharge part of a voltage divider driving the actuator. When a voltage of 3000V is applied to the high voltage terminal (HV), the voltage applied to the actuator will transition from approximately 1140V to 2730V as the user pulls the ring from the non-stretched to the fully stretched state. The result of this is that the weight moves up and down in synchronization with the motion imparted by the user.

The piezoresistive element Rs may be formed as a conductive track on a dielectric elastomer. There are a number of demands on the design of the resistive element. Namely, it must be configured to allow the correct levels of current therethrough (typically less than 1 mA); be tolerant of high voltages (e.g. greater than 4 kV); vary in resistance due to geometric changes and/or percolation effects; preferably vary in a repeatable manner over time; be compliant up to large strains (e.g. hundreds of percent); be easy to tailor in density; and be easily applied or configured in any desired pattern. It is to be appreciated that these are design considerations and that some level of compromise between the factors will need to be arrived at for any particular implementation.

The inventors have developed and used a carbon grease mix that at least in part meets these needs. One presently preferred constitution includes a mix of Molykote 43G grease and Cabot Vulcan XC72 carbon black, preferably at a ratio of approximately 5:1 (grease:carbon) by weight. The mix essentially forms a paste that can be readily handpainted on to a substrate. It will be appreciated that other techniques could be used, such as deposition, ion implantation, quantum tunnelling composites and carbon nanotubes. Other techniques will also be envisaged.

Figure 4A:
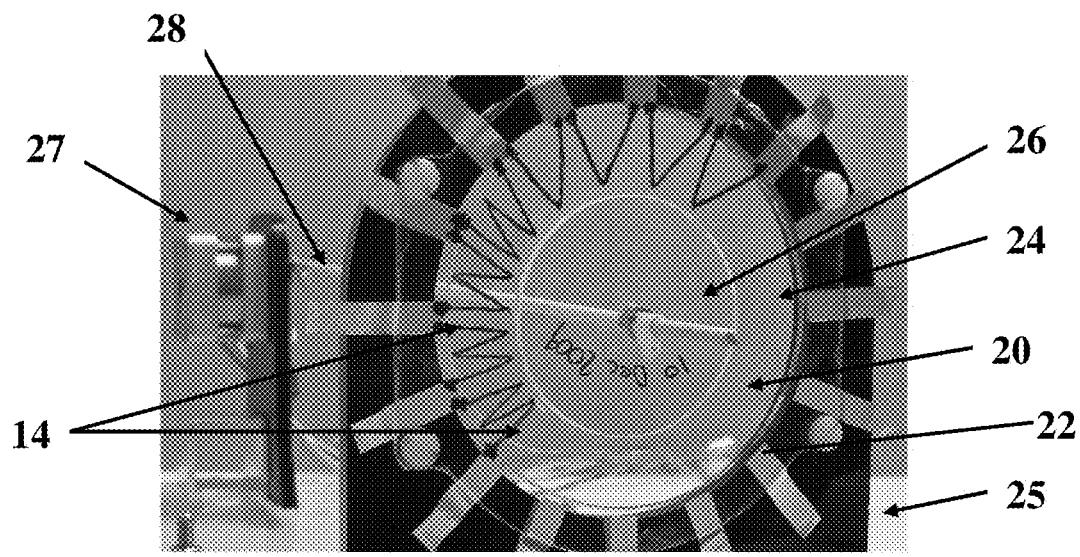
FIG. 4A shows an experimental setup used to assess variation of resistance of a resistive element undergoing deformation.

In the embodiment shown in FIG. 4A, a substantially planar body 20 formed from VHB 4905 (a common, commercially available acrylic material from 3M) was pre-stretched to three times its original size in all directions within the plane of the body 20 and affixed to a 3 mm thick plastic frame 22 with an 80 mm diameter window 24, the frame 22 in turn being supported by frame 25. A 50 mm diameter, 3 mm thick plastic disk 26 was fixed to the centre of the body 20.

A stepper motor 27 was used to displace the centre of the disk 26 via dowel 28. Four approximately 30 mm long M-shaped tracks 14 were painted on to the body 20 substantially within the area bound by window 24 and disk 26. The resistance of each track was monitored as it went through a single 0-15 mm sinusoidal displacement at 0.75 Hz.

Figure 4B:
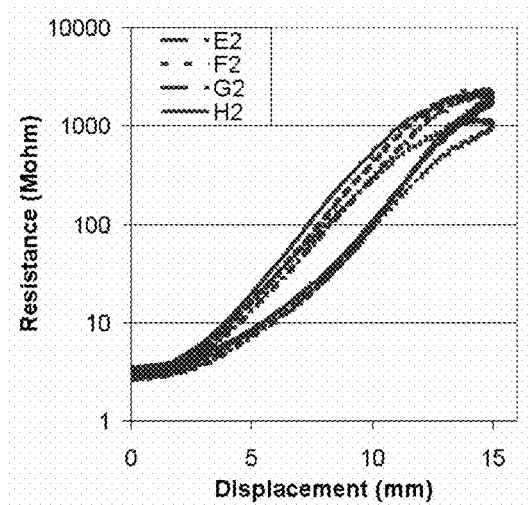
FIG. 4B illustrates results obtained using the setup of FIG. 4A.

The results for this taken one day after fabrication are displayed in FIG. 4B. The change in resistance is clearly considerable, and over the 15 mm displacement, sufficient to enable switching of a small DED of a few nanofarads. The variation between samples (possibly due to the handmade process) and the hysteresis across the full displacement range, is negligible when compared to the overall variation and not of concern where it is merely necessary to determine between an on or off state.

Figure 5:
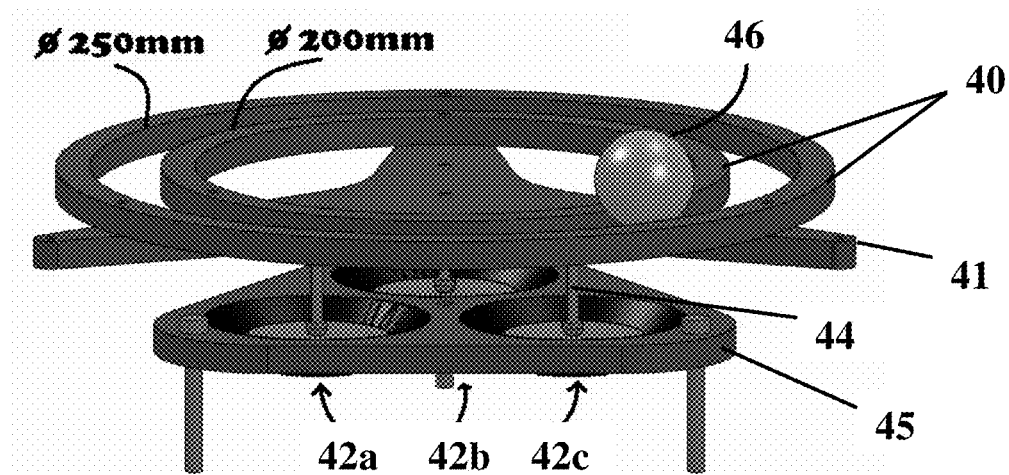

FIG. 5 illustrates an arrangement designed and used by the inventors to demonstrate the capabilities of the invention. The setup includes a circular track defined by rails 40 that are mounted on support 41. The support 41 is mounted on DEDs 42$a$, 42$b$ and 42$c$ via disks 26 (see FIG. 6) and pillars 44. The DEDs 42 were supported by frame 45. The arrangement of FIG. 5 was used to move the ball 46 along the track by appropriate actuation of DEAs incorporated within the DEDs 42. The control to effect this motion was achieved by augmenting the DEDs 42 with DES functionality such that they inherently provided the sensor feedback, logic and driver circuitry.

Figure 6:
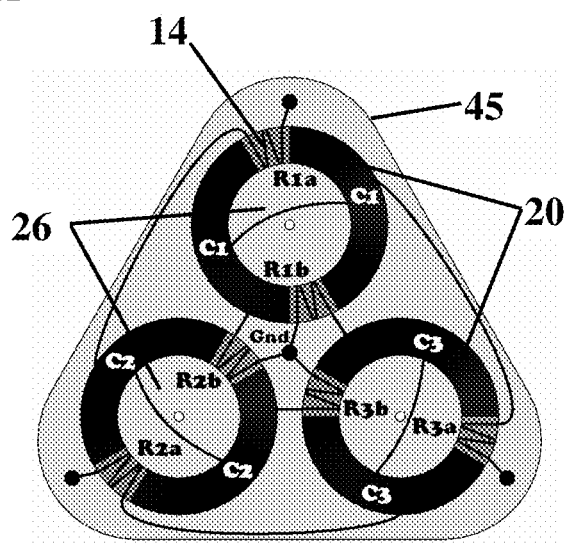
FIGS. 5-7 are perspective, schematic and circuit diagrams of one embodiment.
Figure 7:
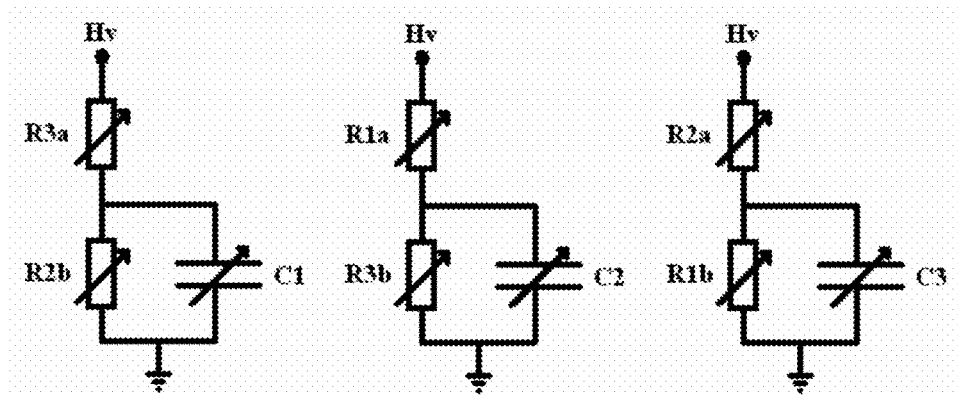

FIG. 6 is a schematic representation of the active portion of the apparatus of FIG. 5. The DEDs 42 of FIG. 6 include DEAs (dielectric elastomer actuators) formed from actuator sections $C_{1-3}$ and DESs $R_{1a-3a}$ and $R_{1b-3b}$ including tracks 14. The electrical connections therebetween are also shown. FIG. 7 provides equivalent circuit diagrams.

Each DED 42 was configured as shown in FIG. 6, with the tracks 14 formed in a similar manner to those of FIG. 4A and the body 20 subjected to a similar level of pre-stretching. The actuator sections $C_{1-3}$ were formed using Nyogel 756G carbon grease. While only one side of the apparatus is shown in FIG. 6, each actuator section $C_{1-3}$ preferably comprises a pair of electrode layers spaced apart by the dielectric elastomer body 20. It will be appreciated that alternative electrode designs could be employed.

The actuator sections $C_{1-3}$ had a capacitance of approximately 2 nF and are shown split into two halves, with the tracks 14 positioned therebetween (see FIG. 6), such that each device included two switching sections. The first switching section of each device is marked $R_{1a-3a}$ and controls the charging current of the next actuator in an anticlockwise direction. The second switching section in each device is marked as $R_{1b-3b}$ and controls the discharge current of the next actuator in the clockwise direction.

While the operation will be described in more detail, essentially, the downwards displacement of any one actuator will activate the actuator in the clockwise direction and deactivate the actuator in the anticlockwise direction. More particularly, on application of 4 kV to the high voltage terminal Hv and positioning of the support 41 and rails 40 on the DEDs 42, all three DEDs displace downwards approximately 8 mm under the weight being supported. Referring to FIG. 4B, the resistance of the tracks 14 will be approximately 50 MΩ. From FIG. 7, it can be determined that the voltage applied to each actuator $C_{1-3}$ will be approximately 2 kV. The application of the voltage causes the actuators to actuate such that the disks 26 are urged downwards. In the example arrangement, the centres sink to a 9 mm displacement, resulting in the resistances increasing to approximately 80 MΩ, but the applied voltage remaining substantially stable at 2 kV. Placement of the 35 g ball 46 on the rails directly above actuator $C_1$ displaces the disk 26 of that DED to 11 mm. The deformation of the other two disks 26 changed to approximately 8 mm. Table 1 presents the instantaneous effect of these displacements resulting from placement of the ball above actuator $C_1$, the values for which can be determined using FIGS. 4B and 7.

TABLE 1

| Designator | Approximate Value |
|---|---|
| $R_{1a}$, $R_{1b}$ | 700 Mohm |
| $R_{2a}$, $R_{2b}$, $R_{3a}$, $R_{3b}$ | 50 Mohm |
| $VC_1$ | 2000 V |
| $VC_2$ | 266 V |
| $VC_3$ | 3733 V |

The increased voltage on $C_3$ causes it to actuate to 12 mm displacement and the decreased displacement on $C_2$ causes it to relax back to 7 mm displacement. The rails 40 therefore tilt and the ball rolls towards $C_3$. As the ball rolls around the rails, the tilt of the rails will follow it, accelerating until it reaches a maximum speed. This analysis is illustrative only. In reality, the system is highly dynamic and its states will change continuously over time. The example apparatus operated at 0.7 Hz, corresponding to a maximum ball velocity of approximately 0.5 ms$^{-1}$. Changing the supply voltage provided an effective mechanism of controlling the speed of the array which means that either the array is rate limited by the charging and discharging currents through the switches, or that increasing the voltage shifted the switches to a more sensitive average displacement.

According to an alternative setup, each of the three DEDs of FIG. 6 was reconfigured to include only a single switch, with the actuators $C_{1-3}$ being provided substantially completely around the disks 26 with only one void for the respective switch. This arrangement is illustrated in FIG. 8A, in which terminal A connects to the DES, terminal B connects to the electrode provided on the upper surface of the DEA and the DES, and terminal C connects to the electrode on the lower surface of the DEA.

Figure 8A:
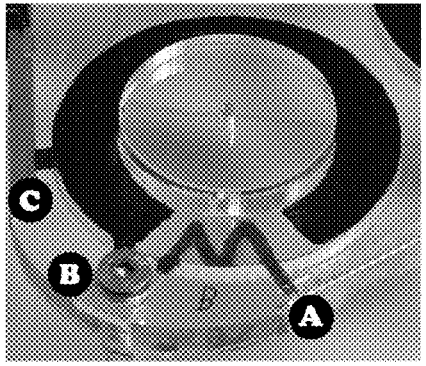
FIGS. 8A-B are perspective and circuit diagrams of an alternative arrangement to that of FIGS. 5-7.
Figure 8B:
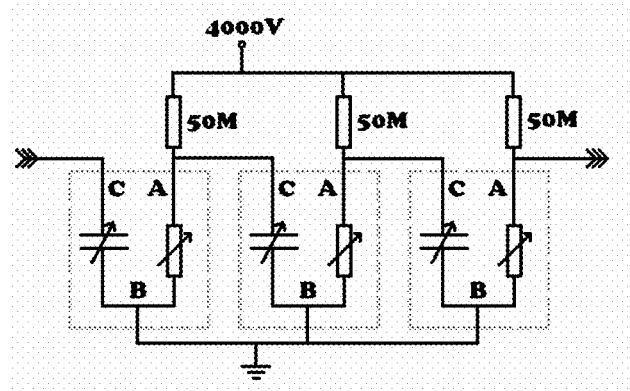

The equivalent circuit for the three DEDs connected together is provided in FIG. 8B. The switching elements are arranged as shown in FIG. 8 so that each forms a voltage divider with a 50 MΩ fixed resistance. As the central coupling point is displaced out of the plane, the resistance of the switching unit increases substantially due to percolation and geometric effects, this has the effect of raising the output voltage. Terminal A of each of the three phases is connected to terminal C of the next phase in the array so that as each actuator displaces down under the weight of the ball it activates the next, tilting the platform and rolling the ball forward. In this way the ball will continue to roll around the track as long as power is applied.

Figure 9:
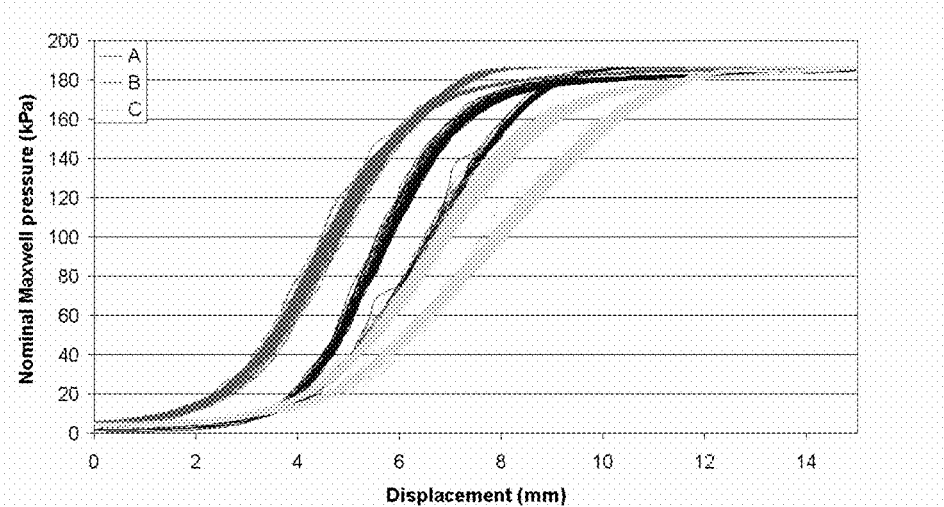
FIG. 9 is a chart of nominal Maxwell pressure versus displacement.

The nominal Maxwell pressure for each phase using an array of devices according to the embodiment of FIG. 8A with a 4 kV supply and undergoing a sinusoidal 0-15 mm, 0.75 Hz displacement is provided in FIG. 9. The Maxwell pressure is the actuation pressure of the actuator and can be given by $P_{max}=\varepsilon_o\varepsilon_r E^2$, where $\varepsilon_o$ and $\varepsilon_r$ are the absolute permittivity of free space and relative permittivity of the material respectively and E is the electric field strength. A nominal thickness of 55 micron was chosen for the dielectric elastomer membrane and a relative permittivity of 4. Note that improved repeatability and/or accuracy and/or reliability can be achieved by appropriate design of at least the conductive tracks and the results provided in FIG. 9 are only intended to be illustrative and in not limiting of the capabilities of the invention.

The arrangements of FIGS. 5-8B do not merely operate in a predetermined sequence. The arrangements detect the position of the ball and control the tilting of the rails accordingly. This is generally not possible without external control circuitry. Furthermore, the response by the actuators is dependent on the location of the ball on the platform. For smooth operation, the actuation signal is strongest when the ball is over the particular element. Sufficient current is required to drive the actuators to respond quickly.

A more conventional arrangement would possibly use an external sensor placed on each device to detect the location of the ball. A microcontroller could have been used to calibrate the sensor data and to implement some control law. High voltage driver circuits could have been used to charge and discharge the actuators. While this arrangement may achieve the same end result, it adds cost, volume, mass and complexity to the system. These limitations may be tolerable when a small number of actuators are used or where precision in the system is paramount, but they are especially problematic when a large array of actuators are required, or when cost is a bigger factor than precision.

Figure 10:
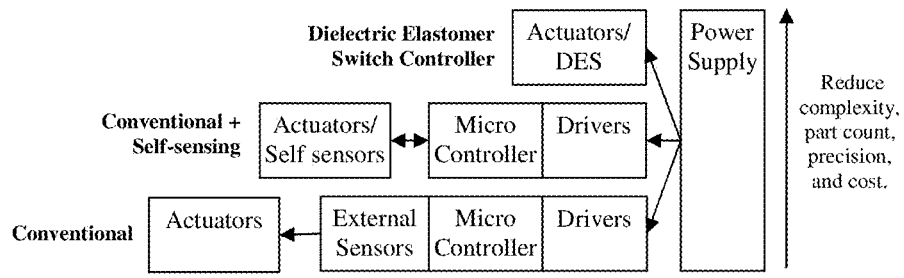
FIG. 10 is a diagram illustrating advantages that may be conferred by the invention.

A further problem with conventional approaches is that it is very difficult to create sensors flexible enough to take full advantage of the large strokes that dielectric elastomers are capable of. The addition of self-sensing functionality, whereby the capacitance or resistance of the actuator are monitored in real time and related to actuator displacement, goes some way to solving this but current approaches still require additional circuitry, such as microcontrollers to implement the control law, and driver circuits. Such circuitry may be eliminated from arrangements according to the present invention. The extent to which component parts can be reduced is schematically represented in FIG. 10.

Thus, embodiments of the invention provide for the integration of analogue and digital or Boolean circuitry into the dielectric elastomer actuator, generator, sensor, damper or hybrid device. This integration means that the switching circuitry scales well with the device size or number of devices.

The oscillators of FIGS. 5-8B are analogue-based, meaning they require careful tuning and are intolerant to degradation or imperfections in fabrication. Further, they are based on a mass-spring system, which may not be suitable for miniaturization or integration into an arbitrary circuit, FIGS. 34A-B show a ring oscillator that goes at least some way to addressing these problems, firstly by switching to being digital-based and secondly by removing or at least reducing reliance on mass-spring arrangements. The advantages of the arrangement of FIGS. 34A-B over previous arrangements are summarized below:

1) As a digital element, it should be more resistant to fabrication imperfections/degradation;
2) As an electric, rather than mechanical time constant-based device it should be easier to scale/tune to a particular application and be more tolerant of background mechanical vibrations;
3) It provides a good tool for assessing the life expectancy of high voltage DES devices as well as testing the maximum speed of its constituent inverters;
4) It is simple and requires a small number of components to implement.

The oscillator was formed out of 6 subunits, one of which is shown in FIG. 34A. Each subunit consisted of a DES and a two-part DEA formed on 3.5 equibiaxially prestretched VHB 4905 adhered to a 3 mm thick, 75 mm inner diameter Perspex ring. The DEA electrodes were Nyogel 756G. The DES electrodes were a 5:1 mix of Molykote 44 Medium grease and Cabot Vulcan XC72 carbon black applied during stretching so that they were 35% stretched, and highly non-conductive at rest. The two halves of the DEA were connected electrically and when actuated, compressed the central DES, causing a substantial reduction in resistance.

FIG. 34B shows how the subunits were paired to form three inverters that made up the ring oscillator. An equivalent circuit of one subunit is boxed off in the top left hand corner of FIG. 34B. One subunit in each inverter was referenced against a 2800V supply, and the other subunit against ground. The inputs of each subunit were tied together so that when the input was high, the ground-referenced subunit was active, dragging the inverter output low. When the input was low, the supply-referenced subunit was active, dragging the output high.

The oscillator was powered from a Biomimetics Lab 4 channel EAP control unit. To provide enough current a WYE configuration of 15 kOhm resistors was used to tie three 120 µA channels together. To understand the operation of the oscillator, consider an initial condition of all inverters being at half the voltage of the supply. Some small imperfection will cause the output of the $1^{st}$ inverter to be a bit higher than half. This will cause the output of the second to be lower than half, then the output of the $3^{rd}$ to be higher than half, then the output of the $1^{st}$ to be lower than half, and so on (note that other odd numbers of inverters can be used to achieve this functionality). It can be seen here that the gain of the gates must be greater than (-)1, or else oscillations will decay to zero, rather than grow. The oscillations build up until the inverters are saturated and the ring oscillator has stabilized.

In testing the supply was switched on and the output connected to a 5 GOhm input impedance voltage probe. Data was acquired using a national instruments DAQ card and Labview 8.6. Table 2 summarises the performance of the oscillator with FIG. 34C showing supply and output voltages against time for the first 50 s of operation. The amplitude and frequency of oscillation built over time until settling into a stable, saturated pattern at around 40 s. FIG. 34D shows the ring stably oscillating at a little over 1 Hz, 100 s into operation with a substantially square wave, demonstrating that the loop gain was greater than one and that the switching delay of each inverter stage was approximately 333 ms.

TABLE 2

| | |
|---|---|
| Cycles until failure | ~140 |
| Frequency of operation | ~1 Hz |
| Switching delay per inverter | ~333 ms |
| Amplitude | 100% of supply (2800 V) |
| Waveform | ~Square |

The ring oscillator is particularly well suited to driver applications such as multiphase motors or pumps as each inverter stage can act as an out of phase output. For acting as a clock for artificial muscle digital circuitry, the oscillator does not require a spring mass system and should exhibit lower susceptibility to environmental vibrations and be easier to miniaturise.

Figure 11:
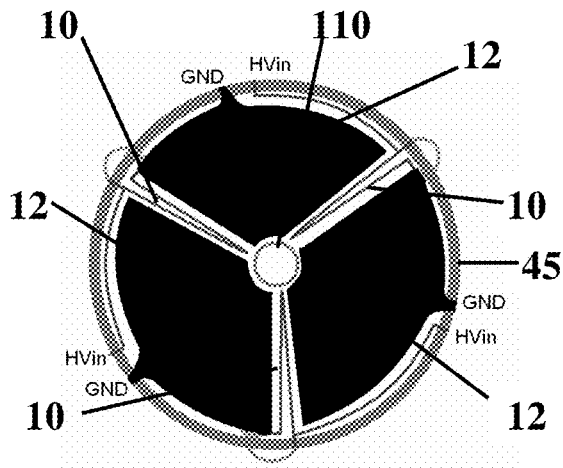
FIG. 11 illustrates an example layout of a DES incorporated within a motor.

An example application is illustrated in FIG. 11, which illustrates a configuration which may be used to generate rotary motion, for example, using a suitably configured crank mechanism coupled substantially centrally in the illustrated device. The arrangement includes three DEAs 12 each coupled to a frame 45. Appropriate actuation/deactivation of the DEAs 12 enables the drive element 110 to move in a desired manner. Between each of the DEAs 12 is provided a DES 10 for switching the adjacent element when any particular element is stretched. Consequently, this arrangement can be used to provide a substantially planar actuator and associated control, which may, for example, be used as a rotary motor.

Further example devices that may be realised using the DES concept of the invention are described hereinafter. Generally, these realizations fall into one of four categories:
1) "Bounded membrane" where a stretched dielectric elastomer membrane is held in a frame with fixed or moving boundary conditions. These devices are relatively simple to make. A bounded membrane may be included within a larger membrane or a portion of a membrane may be bounded off from other portions thereof. The larger membrane may or may not be bounded. An example of such an arrangement is provided in FIG. 32A where a bounded portion 321 included with a larger dielectric elastomer body 322 is at least partially shielded from the influence of strains due to deformations imparted by elements outside of the bounded portion 321. In such an arrangement, the bounded portion 321 may contain logic circuitry as described hereinbelow. FIG. 32B shows an alternative arrangement in which strains imparted by elements external to the bounded portion 321 are selectively permitted by selective absence of portions of the frame. Note that the concept of using frames is not limited to two dimensions and may be provided between vertically stacked DEDs. It is also not limited to a bounded portion being located within a larger dielectric elastomer body. For example, discrete bodies may be positioned side by side or in any other arrangement where deformation of one element can impact on another element.
2) "Infinite membrane" where a very large stretched membrane is used compared to the size of the DES elements. This is a useful layout for complex systems of many switches. Designs can be substantially different to the bounded membrane case.
3) "Multilayer membrane" where multiple stretched dielectric elastomer membranes are stacked on top of each other. This covers the bounded or infinite membrane case. Multilayer solutions can provide improved transmission of switching action between elements as the strain field is the same on two closely bonded membranes. One difficulty inherent in this design is the creation of vias between membranes.
4) "General Case" where there exists some 3 dimensional piece of dielectric material with a network of dielectric elastomer devices and switches arranged throughout the bulk of the material. Such an arrangement can be viewed as a "soft computer" or "Smart Blob".

Unless otherwise stated or apparent, the underside of the membrane or deformable body in the arrangements described below is provided with a ground electrode.

NOT Gate

Figure 12:
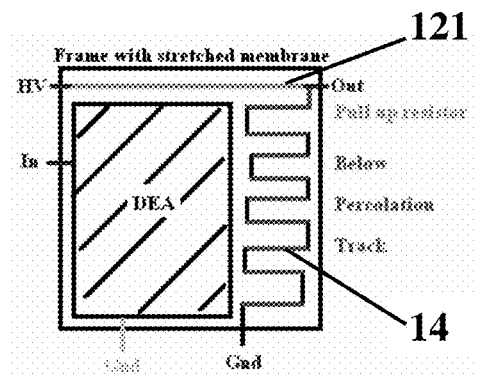
FIGS. 12-13 illustrate embodiments configured as NOT gates.

A NOT gate produces the negation of its input. If a high voltage signal is connected to the input then the output will drop low. If nothing is connected to the input the output will be high. An example of a bounded membrane type configuration providing NOT gate functionality is provided in FIG. 12. The NOT gate consists of a DEA element adjacent to two below percolation tracks. When the DEA is inactive, the output will be at some value between HV (high voltage) and ground as determined by the voltage divider formed by the top track 121 and the track 14. When the DEA is activated by applying a high voltage to the "In" terminal, the track 14 will compress substantially such that the two vertical arrays close together, causing the resistivity to drop. This will decrease the output, as required to perform as a NOT gate.

Figure 13:
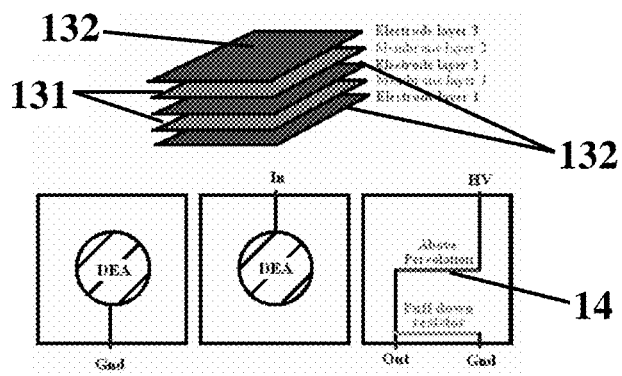

FIG. 13 shows an example of a multilayered NOT gate. Two dielectric elastomer membrane layers 131 are laminated between three electrode layers 132. The lower membrane has a DEA element across it that will expand with the application of a high voltage to the In terminal. The upper membrane will expand in the same place as the lower one since they are laminated together. In this expanding region, an above percolation track is applied. As the area stretches, the track will stretch too, reducing in conductivity markedly and cutting of the high voltage terminal HV from the output. A pull down resistor track is applied away from the local stretch field of the actuator element.

AND Gate

Figure 14:
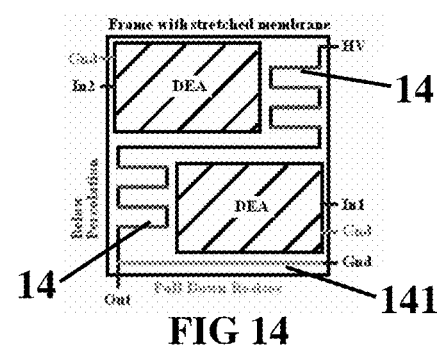
FIG. 14 illustrates an embodiment configured as an AND gate.

An AND gate has 5 terminals, two inputs, an output, a power supply and ground. An example bounded membrane type configuration for an AND gate is provided in FIG. 14. As is common in the art, the membrane is coupled to the frame such that it is under strain. The input terminals (In1 and In2) are connected to respective DEAs so that when the inputs are high, the DEAs expand. Adjacent to each DEA is a section of below percolation (non-conducting) track. The expansion of the DEA causes this track to compress and begin to conduct. When both DEAs are active the entire track will conduct and the HV supply will be connected to the output. A pull down resistor 141 is also shown.

It will be appreciated that further DEA bodies may be provided to receive a corresponding input, each required to be active to generate a high output from the track.

It should be noted that a NOT gate and an AND gate are the only primitives required to form a Boolean computer. In principle, it should therefore be possible to form a dielectric elastomer computer. Such computers have the huge advantage that they can be seamlessly integrated with other dielectric elastomer devices such as actuators, generators and sensors.

NAND Gate

Figure 34E:
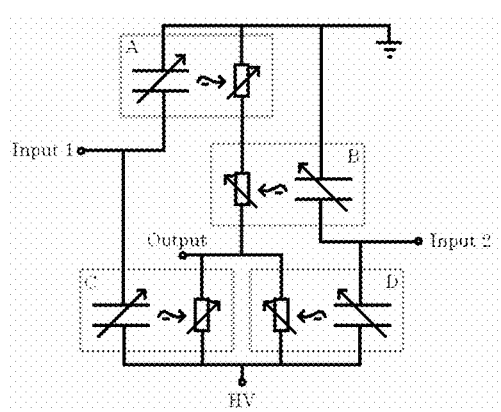
FIG. 34E shows an embodiment configured to function as a NAND gate.

It is also possible to build a NAND gate using the repeating unit shown in FIG. 34A. NAND gates can also be used to form any Boolean circuit. A NAND gate design is provided in FIG. 34E and consists of four said units of FIG. 34A arranged in the circuit shown. The operation of the NAND gate can be summarised in the following way:
1. If both input 1 and input 2 are low, units A and B will be off and units C and D will be on. The output will thus be pulled to the High Voltage (HV) supply, and will be high.
2. If either input 1 or input 2 is high (but not both), either unit A or B will be off, and unit C or D will be on. The output will be high.
3. If both input 1 and input 2 are high, both units A and B will be on, and C and D will be off, and the output will be low.

Voltage Clamp

Figure 15:
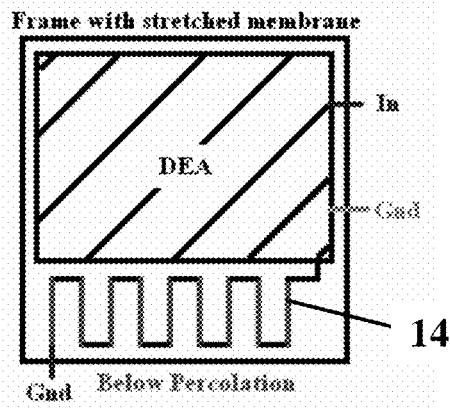
FIG. 15-16 respectively illustrate an embodiment configured as a voltage clamp and an example current-voltage curve derived therefrom.
Figure 16:
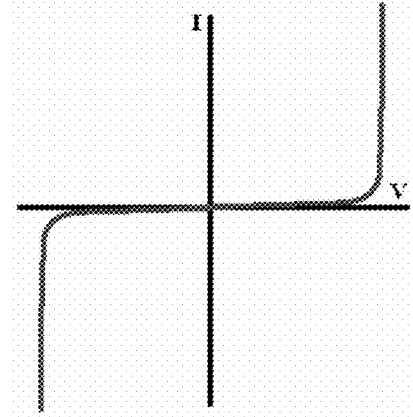

A voltage clamp, as shown in FIG. 15, has three terminals, one input (In) and two grounds (Gnd). The voltage to be clamped is applied to the input. As the voltage rises the DEA begins to actuate. As the DEA actuates it compresses the 'below percolation track', raising its conductivity. At some critical voltage, the track starts to draw significant charge off the DEA. As the voltage increases, the current required to maintain it rises rapidly. The effect could be very sensitive as the DEA will actuate with voltage squared and percolation is also a highly nonlinear phenomenon. This could be a suitable device for protecting overvoltaging in a small dielectric elastomer generator. FIG. 16 shows an example current-voltage curve for a dielectric elastomer voltage clamp. Above the critical voltage, the amount of current required grows exponentially.

Diode

Figure 17A:
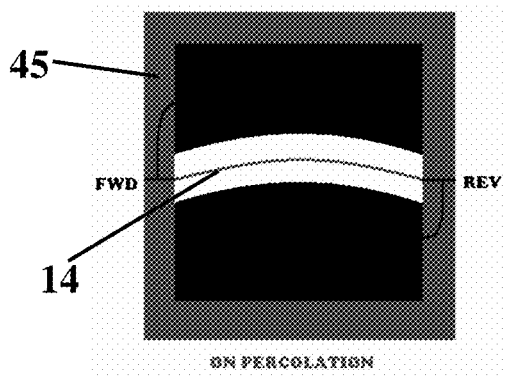
FIG. 17A-B illustrate alternative diode embodiments.

A diode can be formed using a bounded membrane type device as shown in FIG. 17A. The membrane is segmented into three zones:
1) a forward bias DEA (FWD DEA);
2) a reverse bias DEA (REV DEA);
3) a dead zone with the switching element.

The rear side of the diode is grounded. When the diode is in forward bias (the FWD terminal is at a higher potential than the REV bias terminal), the FWD DEA will expand more than the REV DEA. This will cause the centre dead zone with the percolating track 14 to move towards the REV DEA side and compress the track, lowering its resistance. When the diode is in reverse bias the REV DEA will expand more than the FWD DEA, increasing the resistance of the percolating track as it is stretched.

Figure 18A:
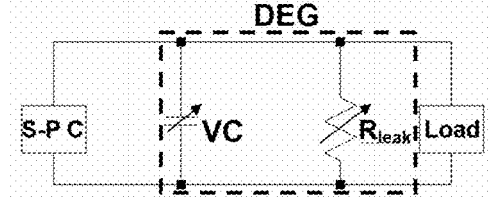
FIG. 18A-C illustrate a DEG arrangement and self priming circuits therefor.
Figure 18B:
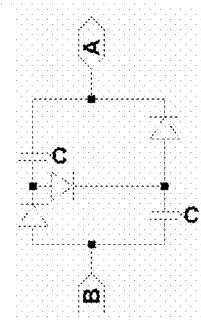
Figure 18C:
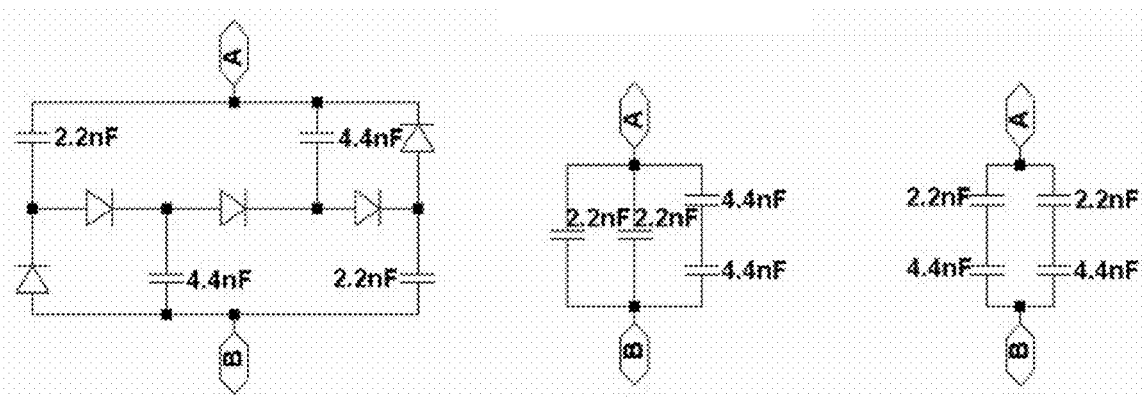

This diode is particularly useful for dielectric elastomers configured to act as generators. For example, FIG. 18 shows a self-priming circuit for a generator taken from New Zealand patent application no. 578275. The circuit of FIG. 18 includes two capacitors of capacitance C and three diodes arranged as illustrated. When a capacitor bank supplies a priming voltage to a Dielectric Elastomer Generator (DEG), current flows from node B to node A. Because of the diodes, when current flows in this direction, the capacitors are effectively arranged in parallel as far as current flow is concerned, meaning the energy is in a high charge, low voltage form. To transfer energy back from the DEG to the capacitor bank, current flows in the direction of node A to node B. When current flows in this direction, the arrangement of the diodes means the capacitors are effectively in series, meaning the energy is in a high voltage, low charge form. In this arrangement, diodes are used to divert a portion of the energy (i.e., charge) generated in a particular cycle, enabling it to be used to charge or prime the dielectric elastomer for a subsequent cycle. With the new diode design presented herein, a self-priming generator could be formed substantially entirely from DEDs, providing a substantially entirely polymer-based, stretchy, self-priming, high-voltage, shock tolerant, and efficient generator.

Figure 17B:
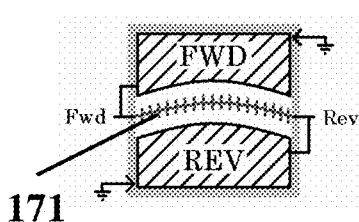

FIG. 17B shows an alternative diode design that is largely identical to that of FIG. 17A and only differences are described. The embodiment of FIG. 17B includes ribs 171 that serve to constrain the DES to deform substantially only in the length direction. The ribs may be on the underside of the dielectric elastomer body. While not shown, the ribs 171 may be provided for other embodiments of the invention (e.g. in the arrangements of FIGS. 24-25).

Neuron

Figure 19:
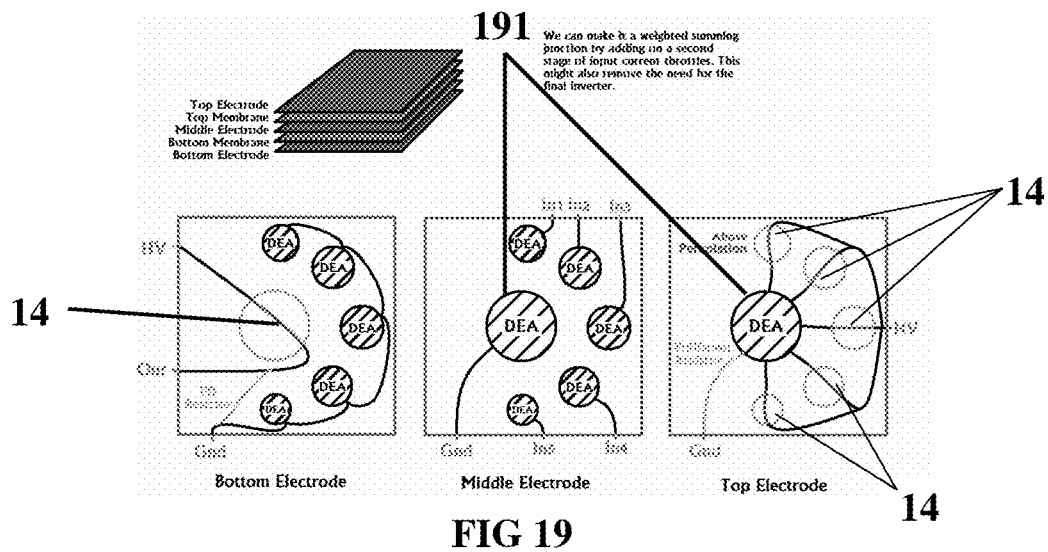
FIG. 19 illustrates an embodiment configured as a summing junction.

An artificial neuron produces an output corresponding to a series of weighted inputs. In a sense, it is a weighted summing junction. Such a device could be created using multiple DESs to control the total current moving into a junction. The first step in the design is a summing junction, which is shown in FIG. 19. Each input to the junction terminates at a DEA element. Increasing the voltage causes the DEA to stretch more. On the top electrode layer there is a just-above percolation track above each input DEA. The stretching of the DEA causes the track to increase substantially in resistivity. The material could be tuned to enable the transition about the percolation point to occur over the full actuation range of the DEA. This increase in resistivity controls the current that each track allows into the large central DEA 191. The discharge resistance is held constant with the pull down resistor and the voltage across the large DEA 191 will be the balance between the different charging and discharging currents. The large DEA 191 then controls the current through a final switch which acts to invert the output, providing a summing junction, not an inverse summing junction.

Figure 20:
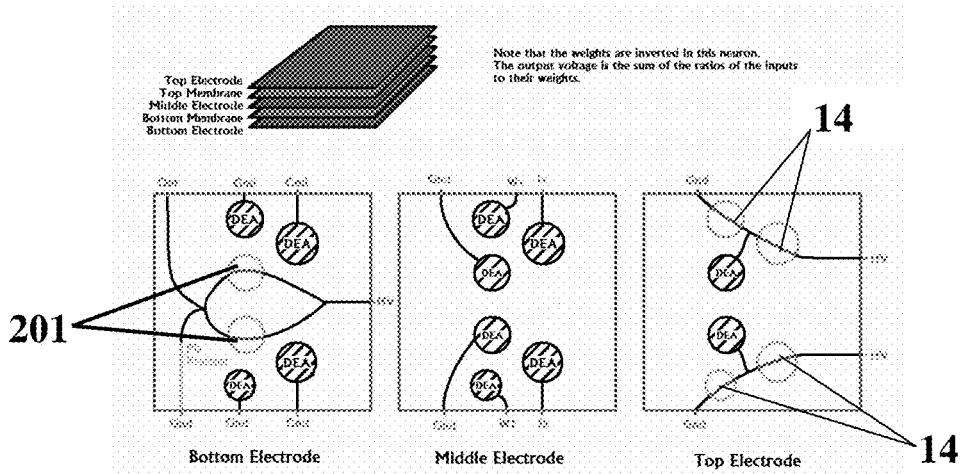
FIG. 20 illustrates an embodiment configured as a neuron.

To make a neuron we need to be able to weight the inputs. This can be achieved by adding a second set of inputs corresponding to the weights. A two input neuron is illustrated in FIG. 20. The voltage on the two DEAs in the centre of the membrane is proportional to the ratio of the voltages applied to the input and weight terminals. The voltages on the two middle DEA 201 are summed and the sum is the output.

Mechanosensitive Cilia Array

Figure 21:
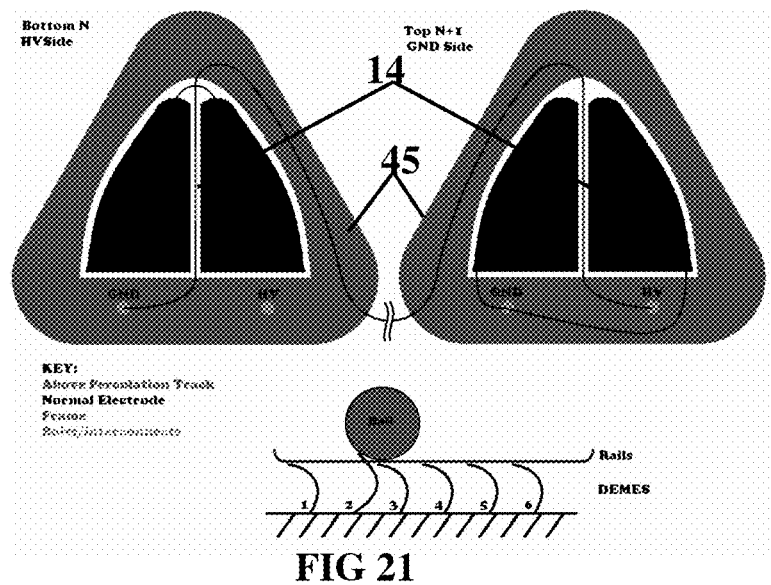
FIG. 21 illustrates an embodiment for use in a mechanosensitive cilia array.

A mechanosensitive DEMES (Dielectric Elastomer Minimum Energy Structure) array made using DES is shown in FIG. 21. DEMES arrangements have been described by B. O'Brien, T. Gisby, S. Xie, E. Calius, and I. Anderson. In "FEA of dielectric elastomer minimum energy structures as a tool for biomimetic design", Proc. SPIE 7287 (2009); by B. O'Brien, T. McKay, E. Calius, S. Xie, and I. Anderson in "Finite element modelling of dielectric elastomer minimum energy structures", Applied Physics A: Materials Science & Processing 94, 507-514 (2009); and by B. O'Brien, E. Calius, S. Xie, and I. Anderson in "An experimentally validated model of a dielectric elastomer bending actuator", Proc. Spie 6927 (2008).

Each DEMES has two sides, a high voltage side "HV" and a ground side "GND". The upper left hand portion of FIG. 21 shows the high voltage underside of the nth DEMES in the array, and the upper right hand portion shows the ground side of the n+1th DEMES. Down the centre of each side of the DEMES between the electrodes of the DEDs is an above percolation track that conducts when the DEMES is in its equilibrium state, and becomes non-conducting when the DEMES moves towards the flattened state. The high voltage side of the nth DEMES forms the discharge resistance for the nth DEMES. The ground side of the n+1th DEMES forms the charging resistance for the nth DEMES. The discharge track is shorter than the charging track to ensure that the DEMES is substantially off in the equilibrium state. A side sectional view of the array of DEMES is shown in the lower portion of FIG. 21. The operation of the array is as follows:

The tip of the first DEMES is displaced forward by an external load, the discharge path on the DEMES is stretched, raising the voltage on the DEMES and causing it to actuate to hold its displacement.

The 1st DEMES pushes on the second DEMES, causing it too to actuate in the same manner as the first. There is an additional effect however; the actuation of the second DEMES stretches the charging resistance of the 1st DEMES, causing the voltage to drop back to low levels, turning the 1st DEMES off.

The wave of actuation propagates down the array. If there is a load on the array (such as the ball on rails shown) then the wave speed will be mediated by the load forming a useful conveyor/propulsion system.

Low Current Driver

Figure 22:
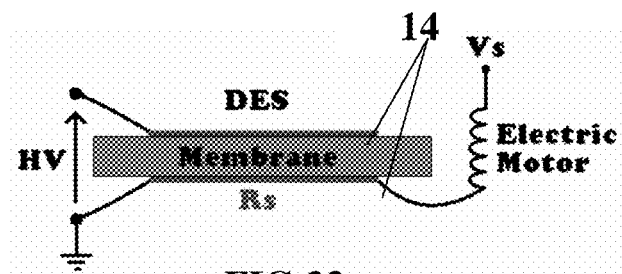
FIG. 22 illustrates an embodiment configured as a low voltage current driver.

As DES are essentially variable resistance switches, they can be used to directly drive low voltage devices. An example arrangement embodying this concept is shown in FIG. 22 where the current through an electric motor is controlled with the resistance on the ground side of a DEA/DES. Another application is for the tuning of a variable resistance for other devices. A variable filter could, for example, be created where the voltage on a DEA is used to control the resistance of a filter component.

Latch

DES/DEA pairings in a state of positive feedback can be used to create a memory element. That is, activation of the actuator deforms the switch so that the voltage on the actuator rises further, in turn deforming the switch ever more until the system reaches saturation. In addition to a state retention property, the memory element also requires an ability to set and read the state of the device.

Figure 23A:
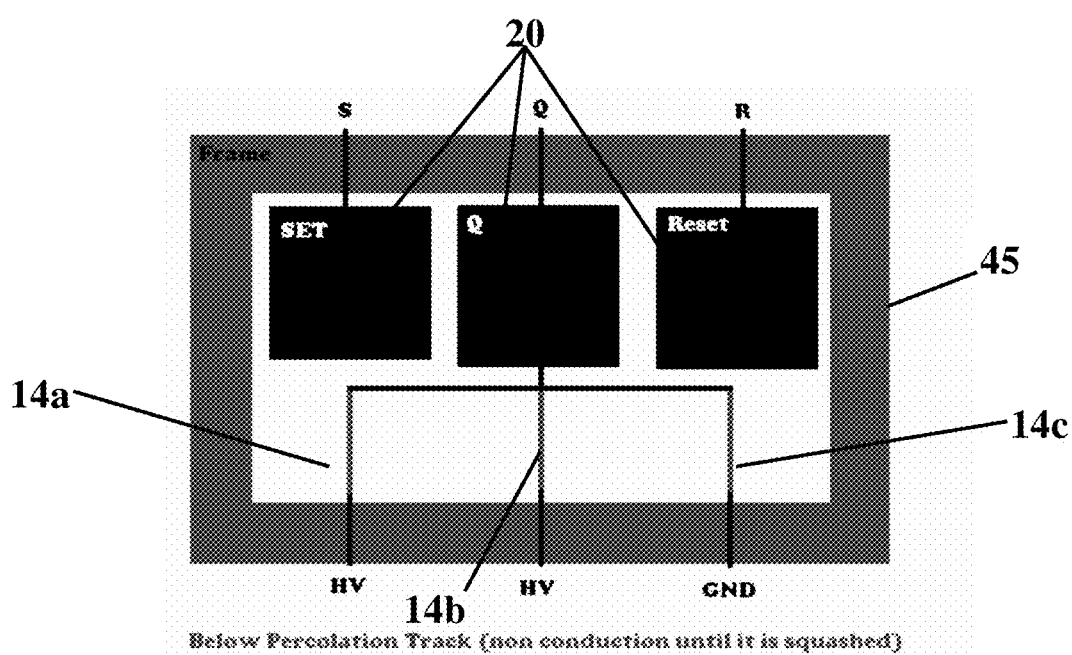
FIG. 23A illustrates an embodiment configured as a latch.

It is possible to make a latch using a DES and an example arrangement is shown in FIG. 23A. When the SET DEA is actuated, the track 14a below it will be compressed, raising the voltage on the Q DEA. The Q DEA will in turn actuate and compress the track 14b under it. The compressed track 14b has the effect of a latch, maintaining the high voltage on Q, even if the SET DEA drops low. The actuated Q can be reset by activating the RESET DEA, which will compress the track 14c under it, and discharge the Q DEA. With a NOT gate as described hereinbefore, this SR or SET-RESET latch could easily be made into a D latch.

The basic operation of a Set Reset (SR) flip flop or latch is given in Table 3. The flip flop remembers the last input and only changes if the set or reset line goes high.

TABLE 3

| SR Flip Flop Operation | | |
| --- | --- | --- |
| Set | Reset | Q |
| 0 | 0 | Previous Q |
| 1 | 0 | 1 |
| 0 | 1 | 0 |
| 1 | 1 | NA |

Figure 23B:
FIGS. 23B-C illustrate an alternative embodiment of a latch.

An alternative, simpler arrangement is shown in FIG. 23B. This arrangement was evaluated experimentally with a membrane of VHB 4905 pre-stretched 3.25:3.25 and affixed to a circular Perspex frame with an 85 mm inner diameter. In the free area of the membrane, two DEA were patterned using Nyogel 756G carbon grease so that there was an approximately 20 mm wide strip between them. Within the strip a DES element was patterned out of a 5:1 mix of Molykote 44 Medium grease and Cabot Vulcan XC72 carbon black. The DES had a total of 60 mm of track aligned horizontally between the DEA and stretched 1.36:1.36 at rest.

Figure 23C:
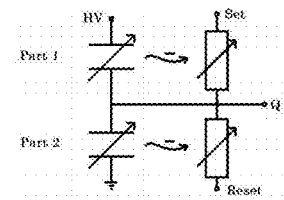

The two DEA of FIG. 23B were connected together so that when they were activated, they compressed the central DES track below percolation, substantially lowering its resistance. FIG. 23C shows how the flip-flop was formed with two repeating parts connected together. The output Q is remembered when Set is low and Reset is high. Driving Set high will set Q high, and driving Reset low will set Q low. The state where Set is high and Reset is low is not allowed and will set Q to some middle 'tri state'.

Note that the voltage divider between the Set and Reset line consisted of two active DES. The divider could have been achieved using one DES and a fixed reference resistance however this would have suffered from the problems that if the percolation threshold of the DES wandered, the divider would become substantially high or low, and also that either the discharge or the charge rate would be limited. Using a dual active divider avoided these problems. Further, the element was designed so there could be no short circuit between the Set and Reset inputs as there was always one DES with a high resistance in the on and off configurations. Additionally the DES did not conduct when their partnered DEA were at half voltage.

Figure 23D:
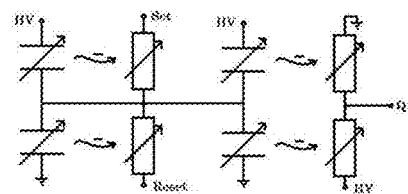
FIG. 23D shows the circuit of FIG. 23C provided with a buffer.

The flip-flop of FIG. 23B-C is a SR flip-flop with an inverted reset input. Thus for actual implementation as a SR flip-flop, an inverter is required. The inputs of the flip-flop directly drove the outputs, meaning it could not be cascaded without a buffer circuit. FIG. 23D demonstrates the flip-flop with the addition of a buffer stage to enable cascading.

Figure 23E:
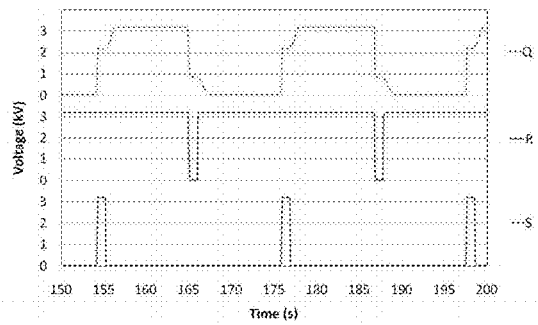
FIGS. 23E-F show results obtained using the arrangement of FIGS. 23B-C.
Figure 23F:
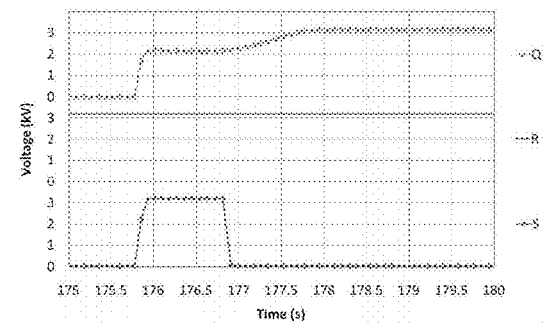

The performance of the device of FIGS. 23B-C was tested using a 4-channel Biomimetics Lab EAP controller and the output measured with a 5 GOhm input-impedance high voltage probe. Data acquisition was conducted with a National Instruments DAQ card and Labview 8.6. The results are presented in FIG. 23E which shows that the flip-flop behaved correctly when connected to a 3200V HV supply with 1 second set and reset pulses. The response to a set or reset pulse had two clear stages as shown in FIG. 23F which is zoomed in on a set pulse. Stage 1 was the instantaneous response where Q immediately steps up to some fraction of S. During stage 2 positive feedback took over and Q continued to climb until it was saturated and locked in place.

Inverting Schmitt Trigger

Schmitt triggers are essentially digital hysteretic components. They track an input, but with hysteresis defined by two thresholds (see Table 4). If the input goes above the upper threshold the output is high. If the input drops below the lower threshold the output is low. If the input is between the thresholds the output does not change. Schmitt triggers thus remember their previous state and are useful for de-bounce, oscillator, and timing circuits.

TABLE 4

Schmitt Trigger Operation

| Input | Q |
|---|---|
| Input > $T_{High}$ | 1 |
| Input < $T_{Low}$ | 0 |
| $T_{Low}$ < Input < $T_{High}$ | Previous Q |

A DES inverting Schmitt trigger based on a SR flip flop was designed and a single element of the setup is shown in FIG. 33A. The design was based on three VHB 4905 membranes pre-stretched 3.67:3.67 and affixed to frames with 100 mm by 100 mm windows in the middle. A single approximately 60×70 mm DEA was painted on each membrane and a 36% stretched DES was applied next to it. Expansion of the DEA resulted in compression of the DES and a drop from a high to low resistance. Each frame had four corner legs which served as electrical interconnects for the four terminals of the device.

Three elements shown in FIG. 33A were connected together to form the device and the resulting circuit layout is shown in FIG. 33B. Note that the R unit had its DES element halved in size to ensure that at rest, its resistance was approximately half that of the S and Q elements. The input of the inverting Schmitt trigger R was connected to S which was inverted by referencing it against a high voltage instead of ground. The input-output waveforms of the fabricated Schmitt trigger are given in FIG. 33C for a high voltage supply of 4 kV, an inverting reference voltage of 3.5 kV for the S DEA, and a 0.35 Hz 0-3.5 kV triangle input signal.

As can be seen in FIG. 33C, switching between high and low outputs occurred when the input fell below about 600 V and rose above about 2900 V, respectively. The behaviour and thresholds were governed by the displacements required to drive the switches past their percolation thresholds as well as the reference voltages. Thresholds could be tuned by changing the reference voltages or the geometry of the components.

Buffer and Opamp (Operational Amplifier)

Figure 24:
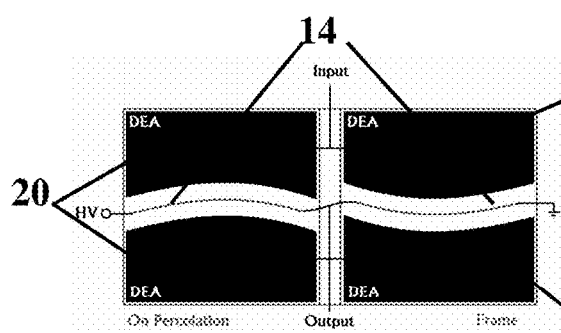
FIG. 24 illustrates an embodiment configured as a buffer.

FIG. 24 shows a design for a DES buffer. The purpose of the buffer is to produce an output voltage equal to the input voltage despite changing current demands. This acts to shield the input line from drawing more current than it is able to supply. The buffer presented here uses two curved percolating tracks that form a voltage divider between four DEA formed on a pre-stretched membrane mounted on a frame.

The back of the DEA is grounded. When the voltage applied to the input DEA is larger than the voltage on the output DEA the centre dead zones are distorted down. This compresses the left and stretches the right percolating tracks 14, increasing the resistance on the right and lowering it on the left, thereby increasing the voltage on the output DEA. If the output DEA has a larger voltage than the input DEA, the reverse happens, lowering the voltage.

As the buffer adjusts the output in proportion to the error, the system can only track a voltage within the tolerances of the materials and fabrication efficiency.

Figure 25:
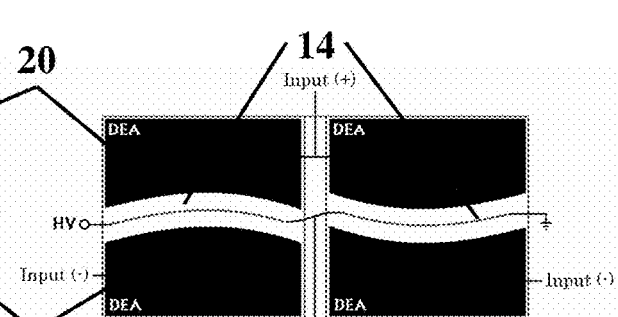
FIG. 25 illustrates an embodiment configured as an opamp.

With a small modification, it is possible to arrive at a DES opamp as shown in FIG. 25. In this embodiment, the output voltage is approximately equal to K*((Input+)−(Input−)). Where K is the gain of the system and input+ and input− are the voltages on the input terminal. Note that in reality the relationship will be more complex than this, the equation is merely illustrative. The creation of an OPAMP is a critical piece of analogue circuitry, from which many circuits can be derived such as filters, drivers, feedback, and analogue logic devices. Thus, while many embodiments of the invention have been described using digital components or configured to provide a digital output, the invention is not limited thereto.

Frequency Multiplier

Figure 26A:
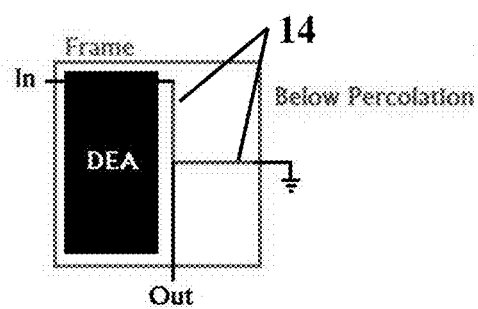
FIG. 26A-B respectively illustrate an embodiment configured as a frequency multiplier and a possible voltage curve derived therefrom.
Figure 26B:
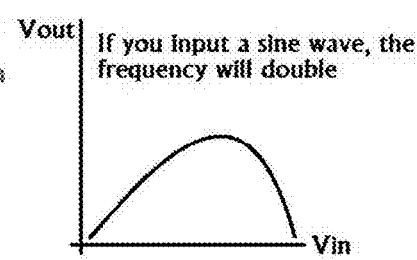

A frequency multiplier is shown in FIG. 26A. The frequency multiplier consists of a DEA and a DES voltage divider formed by two below percolation tracks 14. The tracks are arranged so that when the DEA expands due to the application of a voltage to the "In" terminal the lower member of the ladder is compressed, whilst the length of the upper member remains largely unchanged. This has the effect of making the ratio of the voltage divider drop with increasing voltage. As both Maxwell pressure and percolation effects are nonlinear the output voltage is approximately 50% of the input voltage for low voltages, and drops back to zero for very high input voltages. Thus if a sine wave of sufficient amplitude is applied to the input terminal the output terminal will output a periodic wave with twice the frequency, as illustrated in FIG. 26B.

FIG. 27A shows a frequency multiplier that uses above percolation tracks 14 and a hybrid DES/DEA for one of the electrodes. The top electrode is made of an above percolation electrode, whereas the bottom electrode is simply grounded with a normal electrode. The input terminal is at one end of the rectangular DEA and the output terminal is in the middle, the other end of the strip is grounded. For low voltages the ratio of output to input voltage is approximately 50%. As the voltage climbs this ratio drops, as the top end of the device will begin to charge up, causing the electrode to expand, and raise its resistance at the top end at a greater rate than the resistance raises at the bottom end. At some point an increase in input voltage will start to produce a decrease in output voltage, with the output voltage tending to zero. This will form a frequency multiplier as before. Successful working of this device is dependent on careful tuning of electrode properties. This arrangement illustrates an example embodiment where the DEA and the DES are more integrally formed.

FIGS. 27B and 27C show a physical setup and circuit layout, respectively, of an alternative frequency multiplier design. According to this embodiment, DEA bodies are positioned either side of a central resistive track which acts as a DES. Actuation of the DEAs compresses the DES element, lowering its resistance. According to the arrangement shown, the DEA is referenced against potential of half that of the high voltage supply HV. If the input is low, the DEA will be active and result in a low output. If the input is at 50% HV, the DEA will be inactive and the output will be high. If the input switches to high, the DEA will activate again, dropping the output to low. Consequently, with a sine wave input, the output waveform will have twice the frequency.

Further Embodiments

FIG. 28 shows a basic oscillator unit formed by stretching a dielectric elastomer (VHB) membrane over an 80 mm diameter support frame. A ring is attached to the centre of the membrane with a 4 mm hole in its centre. Electrodes are patterned on the membrane forming a variable capacitor (the DEA unit) and a variable resistor. An electrode is also painted on the outer frame to form a fixed resistor. The variable resistor has a rest resistance of approximately 6 MΩ, increasing to approximately 20 MΩ when the unit centre ring is depressed down 30 mm. As the centre ring is depressed further the resistance increases substantially up to 50 MΩ due to percolation effects and the stretching of the electrode. This is shown in FIG. 29. The unit has 5 terminals. One for either side of the DEA section and three for the voltage divider. The ladder is formed by connecting the fixed resistor to the variable resistor. When a voltage is applied to the high voltage terminal and the base of the ladder is connected to ground, the voltage divider will output a voltage between the two. Initially when the variable resistance is low, the output voltage will also be low. As the resistance of the variable resistor increases the output tends towards that of the high voltage supply. Note that the arrangements of FIGS. 28 and 29 were configured for incorporation within a wider setup substantially the same as that of FIGS. 5 and 6.

FIG. 30 shows an alternative voltage clamp arrangement for use with a dielectric elastomer generator (DEG). As discussed previously, the amount of charge stored by a DEG can be increased provided that mechanical energy is added to the system. However, there exists a problem in that the voltage should not climb above some threshold or the device will fail due to dielectric breakdown. It is desirable therefore to incorporate a voltage clamp into the device. The clamp shown in FIG. 30 consists of a DES coupled electrically to the generator, such that there is a variable capacitive element connected to the generator (or incorporated into it) and a variable resistor. The capacitor and resistor are arranged in such a way that as the capacitor expands it compresses the length of the resistor, reducing its resistance. This reduction is dramatic because the resistor is formed below a percolation threshold and its slight contraction will dramatically lower its resistance. The resistor is connected between either electrode of the capacitor. When the capacitor is charged above some level, the resistance will drop and begin to conduct current. Further charging above this point requires much more current to overcome the plummeting resistance of the track. In this way the generator is protected from over volting itself and the dangerous excess energy is dissipated as heat.

FIG. 31 shows an arrangement for controlling a dielectric elastomer actuator to be able to hold a particular position using an applied voltage. Without feedback circuitry the actuator is unable to reject a disturbance and is also electromechanically unstable for some load conditions. This can be remedied using a DES. This arrangement is similar to the arrangements used to transport a ball around a circular track. An additional capacitive element is placed radially out from the variable resistance element Rp. A second change is that the resistance Rp is placed to act as the charging resistor for the main actuator Cb, while a fixed resistor Rd acts to discharge. With the application of a bias load placed to put the central loading point down into the page, the actuator will act to move the load up and down with variation of the supply voltage. The percolating track Rp is held in the sensitive regime by the expansion and contraction of the actuator A, allowing the charging of the main actuator at any supply voltage. When a disturbance is applied to the load, such as dragging of the central ring down, the resistor Rp will increase in value and lower the equilibrium voltage on the main actuator, rejecting the disturbance. If the disturbance drives the ring up the opposite will happen. This feedback functionality could alternatively be achieved using an opamp arrangement of the invention.

Particular embodiments advantageously combine the use of one or more DES and one or more DEG, the DES providing all or a portion of the control circuitry for the DEG. More particularly, the DESs may act as switches that toggle between open and closed when a dielectric elastomer body is deformed. "Open" and "closed" may be relative and not require complete opening or closing of a circuit. By integrating or otherwise coupling the DES with the associated DEG such that deformation of the DEG membrane causes the conductive properties of the DES to vary (i.e., by corresponding deformation thereof), the DEG can be configured to cause the DES to switch so that currents within the wider arrangement are appropriately controlled.

Thus, embodiments of the invention provide a charge pump that reduces or eliminates the need for a high voltage power source for a generator, more particularly, a DEG. The charge pump described herein does not require external capacitors to store energy and external diodes to control current flow. Instead, the charge pump is integrated into the DEG by using the capacitance of the DEG for charge storage and switching effected to control current flow achieved using one or more DES, eliminating or reducing the need for rigid parts.

Figure 35A:
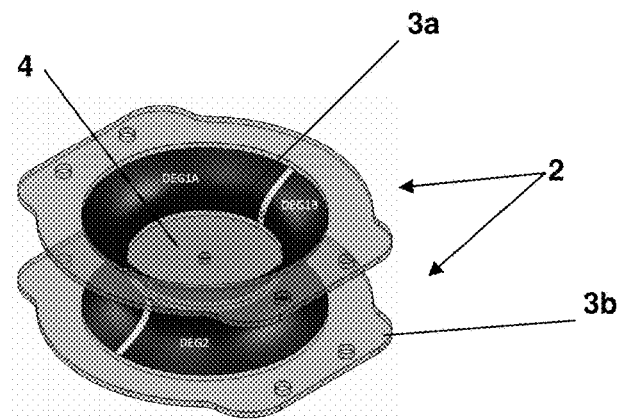
FIGS. 35A-C are alternative views of an embodiment of the invention.

FIG. 35A is a perspective view of an antagonistic pair DEG configuration of one embodiment. The basic configuration is similar to the arrangements described in WO 2011/005123. Two dielectric elastomer membranes 3a, 3b are provided between frame members 2. According to the embodiment shown, the frame members 2 are fixed spatially relative to one another such that movement of central member or hub 4 causes the bodies of DEG1A, DEG1B and DEG2 to deform.

Figure 35B:
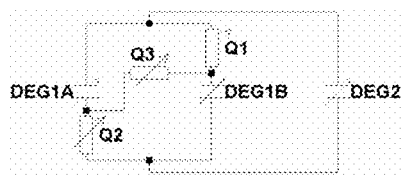
Figure 35C:
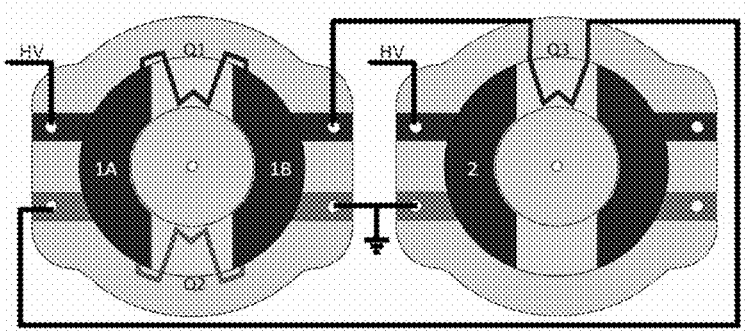

FIGS. 35B and 35C are circuit and schematic diagrams, respectively, of the embodiment of FIG. 35A. As more clearly shown in FIG. 35C, the first membrane 3a is configured to define two DEG, DEG1A and DEG1B (referred to collectively as DEG1). DEG1 may be formed by discrete electrode portions of the same dielectric elastomer body or may be two separate bodies. Membrane 3a is further provided with two switches Q1 and Q2. The second membrane 3b includes a single switch Q3 and DEG2.

When driven 180° out of phase, one of the membranes 3a, 3b is stretched while the other is relaxed. With DEG1 in a stretched state and DEG2 relaxed, the resistance of the switch Q3 was low (in a prototype based on the FIG. 36 arrangement, ~5 MΩ) while that of Q1 and Q2 was high (in the same prototype, ~10 GΩ). Thus DEG1A and DEG1B were effectively connected in series. When the deformation was reversed, the resistance of the switches toggled between high and low to place DEG1A and DEG1B in parallel. By toggling the configuration of DEG1 between series and parallel, the system converted generated energy into a higher charge form. This ability to boost system charge allows losses to be replenished, avoiding the need for an external charge source (i.e., a battery etc) or the self-priming arrangements described in WO 2011/005123. More particularly, self-priming is achieved without the need for external circuitry, particularly diodes.

Figure 36:
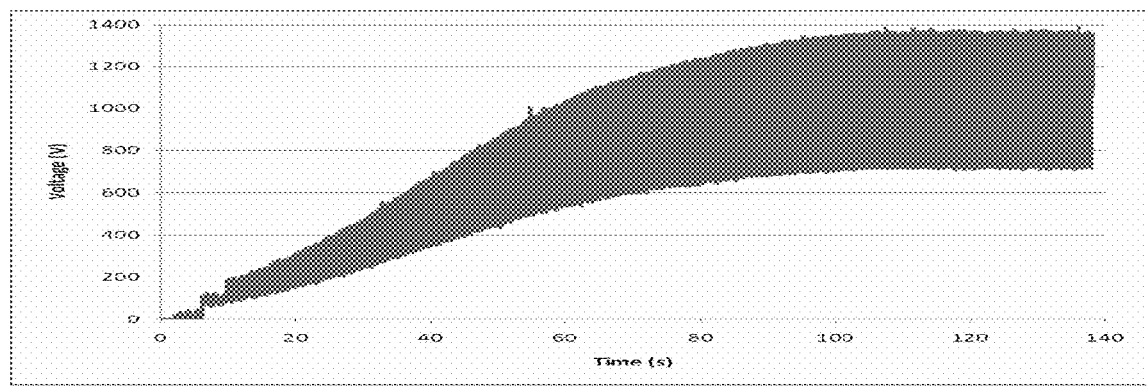
FIG. 36 is a chart of the output voltage obtained using the arrangement of FIG. 35.

The embodiment of FIG. 35A was embodied in a prototype and the output thereof, starting with an initial priming voltage of 100V and cycling at 2 Hz, is given in FIG. 36. In later tests, it was found that an initial priming voltage of 30V was acceptable. As can be seen from FIG. 36, the output voltage rose quickly after application of the initial priming voltage, to as high as nearly 1.4 kV. Further, it is apparent from FIG. 36 that by about 100 seconds, the system was stabilised with the output voltage oscillating between about 700V and 1350V.

The particular configuration shown in FIG. 35A was chosen as it does not require a large voltage swing meaning that it was possible to "over design" the generator so that the system was tolerant to non-ideal switches. Further, since it only contained three switches, it was relatively straightforward to identify any issues with the setup. However, it is possible to use other self-priming circuit configurations.

Self-priming is advantageous for autonomous power generation as it is not necessary to provide an external high voltage source. However, mechanical switches could be provided in combination with or instead of switches Q1-Q3, said switches being configured to open/close at the appropriate time in the DEG cycle. A circuit diagram of such an arrangement is provided in FIG. 37A. Operation is effected by switch $S_1$ only being closed when the DEG is stretched and $S_2$ only being closed when the DEG is relaxed. More particularly, switch $S_1$ controls priming of the DEG whereas switch $S_2$ controls energy extraction (i.e., connection to a load).

A design for a "soft" DEG system that behaves similarly is provided in FIG. 37B. In FIG. 37B, the two DEGs are an antagonistic pair (similar to the arrangement shown in FIG. 35A) that forms two circuits represented in a similar fashion to FIG. 35C. "Soft" switches Q1A and Q1B of FIG. 37B correspond to mechanical switch $S_1$ in FIG. 37A whereas switches Q2A and Q2B correspond to switch $S_2$. Note that in FIG. 37B, all terminals with the same net label are electrically connected.

An electrostatic generator circuit is shown in FIG. 38A. In this arrangement, a portion of the generated energy is used to charge batteries used to prime the system, increasing the length of time before they need to be replaced or more actively charged. FIG. 38B shows the "soft" equivalent schematic arrangement that uses an antagonistic DEG/DES pair. Again the basic setup is similar to that shown in FIG. 35A.

Rather than the more conventional componentry of FIG. 38A which includes diodes $D_1$ and $D_2$ for controlling balancing of priming of the DEG with extraction of energy to a load, "soft" switches Q1A and Q1B replace diode $D_1$ and "soft" switches Q2A and Q2B replace diode $D_2$. In FIG. 38B, all terminals with the same net label are electrically connected and a battery is required, as shown.

FIG. 39 shows cast silicone membranes in the foreground with an assembled device in the background. DEGs may be formed using Nusil silicone and Perspex dies formed using laser engraving. For DEGs, high stiffness is not generally of particular significance, at least when compared with DEA although this may provide some improved level of control.

FIG. 40A schatically shows an alternative configuration to the circuit of FIG. 35B in which both DEG1 and DEG2 include self-priming functionality. While FIG. 40A shows more conventional diodes, these are preferably in the form of DES.

FIGS. 40B-D show further alternative, novel self-priming circuits. Again, while more conventional diodes notation has been used, preferably they are in the form of DES.

While example embodiments have been described using dielectric membranes provided between fixed, substantially rigid frame elements, the invention is not limited thereto and the invention could alternatively be embodied in a flexible arrangement that forms a "soft", self supporting structure. Alternatively, a soft support structure could be cast or adhered onto a Danfoss DEG. Further, RS silicone may for example be used to stitch Danfoss membranes together to arrive at a desired configuration.

Antagonistic pairs are used in the examples because the shown arrangements require current to flow along different paths when the DEG is stretched and relaxed. An alternative to an antagonistic pair would be to utilize structures that deform so that as one segment is stretched another region compresses. For instance, if a band is uniaxially stretched it will neck-in and it is possible to use the compression in the transverse direction to activate a switch that turns off or on as the band is stretched. The band could alternatively be a tube or inflated tube with a band around the centre which relaxes when the tube is axially stretched.

Another application of the invention is as a bending mode generator. When bent, a relatively thick structure is compressed on one side as the other is stretched. This could be solid, inflated, or a soft spring roll.

Finite element analysis applications such as ABAQUS can be used to evaluate the strain fields in potential structures to assess likely deformations and the stresses involved.

While embodiments of the generator of the invention have been described with particular DES configurations, others are included within the scope of the invention. For example, above or below percolation tracks may be used.

Particular embodiments of the invention provide DEGs of low mass and complexity, and high flexibility to be maintained at the system level, rather than just comprising a flexible dielectric elastomer body. The system, including the DEG and power electronics described may essentially simply consist of an acrylic membrane and carbon grease used to formed the electrodes and elements.

Thus the production of lighter, more flexible, cheaper and less complex DEG systems is enabled than current state of the art technologies including the DEG described in WO 2011/005123, electromagnetic, piezoelectric, and traditional electrostatic generators. Broadly speaking, these advances may be achieved by integrating "soft" electronics (for example but not limited to deformable conductive tracks) onto the DEG membrane, so that external circuitry is no longer required. Further, the system is potentially environmentally tolerant, autonomous, scalable and suitable for use in distributed arrays. Further, the system does not require a high voltage charge source, so low cost electronic components can be used, as required. Key advantages of the generator of the invention are set out below.

Environmental Tolerance:

DEGs according to the invention can be fabricated with corrosion resistant and non-magnetic components making them suitable for systems operating in corrosive environments or an environment with low tolerance to magnetic noise (e.g. marine or MRI environments).

Autonomy:

By integrating self-priming electronics onto the DEG membrane, the system can operate without being constantly connected to a power source because self-priming systems boost the charge of the energy generated by DEG so that losses can be replenished. The soft DEG presented here can generate energy (or transform mechanical energy to electrical energy) from intermittent sources and has been demonstrated to be self-primed from 30V, meaning it was able to generate power at 30V. DEG usually operate in the kV range, meaning expensive DC-DC converters are required. In response to a mechanical stimulus, the system could boost its voltage from 30V up to the kV range without a DC-DC converter. Consequently, costs of producing the system are much reduced.

Scalability:

One advantage of DEGs is that they are inherently scale-invariant. However, the mass and bulk of the external circuitry is not often considered and poses a problem when producing small scale DEG for applications such as wearable devices and self-powered sensors. Also, because of the operation at high voltages and low current, there has been mention in the art that the cost of DEG electronics may be a significant disadvantage for small scale applications. The DEG of embodiments of the invention with integrated electronics is very low cost. Further, the integrated electronics could possess similar scaling laws to that of DEG.

Distributed Control:

An array of a plurality including thousands of kelp-like soft DEG could be provided, each with their own local control electronics integrated onto their dielectric elastomer membrane, all supplying energy to a large centralised storage reservoir and regulator circuitry. The distribution of the control electronics greatly reduces the complexity and enhances the robustness of the array.

The generator of the invention shows considerable promise for harvesting energy from environmental sources such as ocean waves, wind, and human motions because DEG can be directly coupled to large broadband motions without gearing while maintaining a high energy density and having few moving parts. These advantages are greatly enhanced by using the DEG embodiments presented here.

The invention could be adapted to produce a highly flexible self-powered sensor. DEG produce a voltage swing that is proportional to the amount of stretch in a cycle. By probing the voltage we can determine the stretch. Also, since the DEG is a generator, it does not require a power source.

Since DEGs consist of materials that lend themselves to a wide range of manufacturing methods, a large range of configurations and scales are possible, from devices for harvesting Mega-Watts of wind energy to those for harvesting energy from human movement for powering mobile electronics.

Unless the context clearly requires otherwise, throughout the specification, the words "comprise", "comprising", and the like, are to be construed in an inclusive sense as opposed to an exclusive or exhaustive sense, that is to say, in the sense of "including, but not limited to".

The entire disclosures of all applications, patents and publications cited above and below, if any, are herein incorporated by reference.

Reference to any prior art in this specification is not, and should not be taken as, an acknowledgement or any form of suggestion that that prior art forms part of the common general knowledge in the field of endeavour in any country in the world.

The invention may also be said broadly to consist in the parts, elements and features referred to or indicated in the specification of the application, individually or collectively, in any or all combinations of two or more of said parts, elements or features.

Wherein the foregoing description reference has been made to integers or components having known equivalents thereof, they are herein incorporated as if individually set forth.

It should be noted that various changes and modifications to the presently preferred embodiments described herein will be apparent to those skilled in the art. Such changes and modifications may be made without departing from the spirit and scope of the invention and without diminishing its attendant advantages. It is therefore intended that such changes and modifications be included within the scope of the invention. Particular reference is made to the component devices described with reference to FIG. 11 onwards. It will be appreciated that such devices may be coupled together or otherwise integrated to form other elements. Also, at least portions of said combinations may be formed from more conventional components and for particular arrangements, at least some components may be removed where there is duplication. Further, while illustrated embodiments have dielectric elastomer bodies in the form of membranes, the invention is not limited thereto and may use any configuration for the deformable body, including being three dimensional. Deformations may be imparted from any angle, including from out of the plane of substantially planar membrane-type devices. Deformations to a DES or a DEA may be imparted as a result of an electrical or mechanical input, including from user interaction with devices of the invention.

The invention claimed is:

1. An electric circuit device comprising:
    a deformable dielectric elastomer device comprising compliant electrodes on first and second opposing sides of a dielectric elastomer layer; and
    a conductive track on the first or second side of the dielectric elastomer layer, the conductive track configured to receive an electrical signal and provide an electrical input to an electrical component, the resistivity of the conductive track being variable based at least on a deformation force applied thereto, the deformation force being normal to a direction from the first side toward the second side of the dielectric elastomer layer;
    wherein the conductive track is coupled directly or indirectly to, or integral with, the deformable dielectric elastomer device such that deformation of the dielectric elastomer device causes the conductive track to be subjected to the deformation force; and the conductive track is substantially above percolation in a first state and substantially below percolation in a second state, wherein deformation of the dielectric elastomer device causes a transition between the first state and the second state.

2. The electric circuit device of claim 1, wherein variation of the electrical input provides or triggers a predetermined response, and wherein the response includes direct drive of the electrical component by the electrical input.

3. The electric circuit device of claim 1, wherein cooperation of the dielectric elastomer device and the conductive track controls the electrical component, wherein variation of the electrical input provides or triggers a predetermined response, and the response providing a control signal to the electrical component.

4. The electric circuit device of claim 3, wherein the dielectric elastomer device, the conductive track, and the electrical component cooperate to provide closed loop control of the electric circuit device.

5. The electric circuit device of claim 4, wherein the electrical signal is generated at least in part by the electrical component and assists at least in part with the closed loop control.

6. The electric circuit device of claim 1, wherein variation of the electrical input provides or triggers a predetermined response, and wherein the response comprises generating a desired deformation of the conductive track.

7. The electric circuit device of claim 6, wherein the dielectric elastomer device is configured to generate the deformation.

8. The electric circuit device of claim 1, wherein the dielectric elastomer device is deformable in response to application of a voltage thereto or thereacross.

9. The electric circuit device of claim 1, wherein application of a voltage to the compliant electrodes causes the dielectric elastomer device to deform.

10. The electric circuit device of claim 1, further comprising the electrical component.

11. The electric circuit device of claim 10, wherein the electrical component is integrated with the dielectric elastomer device.

12. The electric circuit device of claim 1, further comprising a plurality of dielectric elastomer devices, each of the plurality of deformable dielectric elastomer devices comprising compliant electrodes on first and second sides of a dielectric elastomer.

13. The electric circuit device of claim 12, wherein a first and a second of the plurality of dielectric elastomer devices are formed by at least three compliant electrodes provided on a single dielectric elastomer body, and wherein each of the first and the second of the plurality of dielectric elastomer devices comprises at least a first and a second of the at least three electrodes such that application of a voltage to the electrodes causes the dielectric elastomer device to deform, first and second electrodes of the at least three electrodes operatively coupled to form the first deformable dielectric elastomer device and the first and a third electrodes of the at least three electrodes operatively coupled to form the second deformable dielectric elastomer device.

14. The electric circuit device of claim 1, comprising one or more further conductive tracks and/or functionally distinct portions of the same conductive track, each being configured to provide an electrical input to the electrical component or a further electrical component, the resistivity of each conductive track or portion thereof being variable based at least on the extent of deformation thereof.

15. The electric circuit device of claim 14, wherein first and second ones of the conductive tracks are directly or indirectly electrically and/or mechanically coupled.

16. The electric circuit device of claim 14, wherein each conductive track is configured to be deformed by a respective one or more of the deformable dielectric elastomer devices.

17. The electric circuit device of claim 1, wherein the conductive track is electrically coupled to the dielectric elastomer device.

18. The electric circuit device of claim 1, wherein the dielectric elastomer device is configured to act as a capacitor.

19. The electric circuit device of claim 18, wherein mechanical deformation of the dielectric elastomer device varies the capacitance thereof.

20. The electric circuit device of claim 19, wherein the electric circuit device is configured to act as or form part of a charge pump or a generator.

21. The electric circuit device of claim 20, configured such that:

when the dielectric elastomer device deforms or is deformed in a first manner, the resistance of the conductive track changes and results in electrical energy being stored by the dielectric elastomer device as a response; and/or when the dielectric elastomer device deforms or is deformed in a second manner, the resistance of the conductive track changes in a different manner and results in electrical energy being drawn away from the dielectric elastomer device as a response.

22. The electric circuit device of claim 21, comprising a second conductive track and/or a second dielectric elastomer device, the second conductive track and/or dielectric elastomer device configured to cooperate with the first conductive track and/or the first dielectric elastomer device, to perform said storing and/or drawing away electrical energy as said response.

23. The electric circuit device of claim 21, including a second dielectric elastomer device, wherein:

the first dielectric elastomer device comprises first and second electroded zones electrically coupled via first and second elements; and the second dielectric elastomer device comprises first and second electroded zones and a third element, the third element being electrically coupled to the first and second electroded zones of the first dielectric elastomer device.

24. The electric circuit device of claim 1, wherein the conductive track is coupled to or configured to couple to an electrical power supply, and wherein the conductive track and the dielectric elastomer device are configured such that deformation of the dielectric elastomer device deforms the conductive track to control the current from said power source as a response.

25. The electric circuit device of claim 24, wherein the conductive track is directly or indirectly electrically coupled to the electrical component, thereby varying the current provided thereto.

26. The electric circuit device of claim 1, configured to act as a logic device.

27. The electric circuit device of claim 1, configured to act as any one or more of an AND gate, a NOT gate, a NAND gate, a voltage clamp, a diode, a summing junction, a neuron or weighted summing junction, a latch, a buffer, an operational amplifier, a frequency multiplier, a Schmitt trigger, an oscillator, and a low current driver, wherein variation of the electrical input provides or triggers a predetermined response, and wherein the response comprises a transformation of one or more input signals to one or more output signals according to a predetermined logic operation.

28. The electric circuit device of claim 1, further comprising means for inhibiting deformation in one or more directions of the dielectric elastomer device and/or the conductive track.

29. The electric circuit device of claim 28, wherein the means for inhibiting comprises one or more ribs, frame elements or areas of increased stiffness.

30. The electric circuit device of claim 1, comprising means for shielding, at least in part, the dielectric elastomer device and/or said conductive track from deformation from at least one direction.

31. The electric circuit device of claim 30, wherein the means for shielding comprises one or more frame elements or regions of increased stiffness.

32. A circuit comprising at least two electric circuit devices of claim 1.

33. The circuit of claim 32, wherein at least first and second ones of the at least two electric circuit devices are electrically and/or mechanically coupled.

34. The circuit of claim 32, configured to provide drive and/or control of an electric motor or a mechanosensitive cilia array.

35. A charge pump and/or a generator comprising at least one electrostatic generator operatively coupled to at least one electric circuit device as claimed in claim 1, whereby in a first state the at least one electric circuit device directs current to a load and/or in a second state the same or another said at least one electric circuit device routes at least a portion of the energy generated to a storage means, the storage means being adapted to provide charge to the or another said electrostatic generator.

36. The electric circuit device of claim 1, wherein the conductive track is on the first side of the dielectric elastomer device.

37. The electric circuit device of claim 1, wherein the conductive track comprises a plurality of terminals for at least one of the terminals configured to connect to the electrical input and a second of the terminals configured to connect to the electrical component.

38. A method of driving and/or controlling an electrical component, the method comprising:
    providing an electrical signal to a conductive track; and
    deforming a dielectric elastomer device comprising compliant electrodes on first and second sides of a dielectric elastomer by applying a voltage across the compliant electrodes, the deformable dielectric device having the conductive track associated therewith, said deformation causing the resistivity of the conductive track to change based at least on the extent of deformation thereof; and
    providing an electrical input to the electrical component, said electrical input being dependent on said electrical signal and said deformation.

39. A logic element comprising:
    at least one dielectric elastomer device comprising compliant electrodes on first and second opposing sides of a dielectric elastomer layer and at least one conductive track coupled on the first or second side of the dielectric elastomer layer, wherein the at least one conductive track is configured such that application of a deformation force thereto affects the electrical resistance thereof, the deformation force being normal to a direction from the first side toward the second side of the dielectric elastomer layer; and
    the at least one conductive track is substantially above percolation in a first state and substantially below percolation in a second state; and
    the deformation force causes a transition between the first state and the second state.

40. The logic element of claim 39, wherein said at least one dielectric elastomer device and said at least one conductive track cooperate to transform one or more inputs into one or more outputs, said outputs being predetermined but dependent on the one or more inputs.

41. A computing device comprising one or more logic elements of claim 39.

42. A dielectric elastomer switch comprising:
    a deformable body comprising a dielectric elastomer, wherein the dielectric elastomer body is formed from a dielectric elastomer provided with at least first and second electrodes coupled or integral thereto, such that application of a voltage to the electrodes causes the body to deform;
    a path comprising a plurality of conductive particles, the path integral with the deformable body such that deformation of the deformable body causes deformation of the conductive path; and
        the path having a first state wherein the plurality of conductive particles are substantially above the percolation threshold and a second state wherein the plurality of conductive particles are substantially below the percolation threshold; and
        wherein the deformation of the path, caused by the deformation of the deformable body, causes a transition between the states.

43. The dielectric elastomer switch of claim 42, wherein the dielectric elastomer body is non-planar.

44. The dielectric elastomer switch of claim 42, wherein the path is formed in or through the dielectric elastomer body.

45. The dielectric elastomer switch of claim 42, wherein the dielectric elastomer body comprises a boundary member to shield the dielectric elastomer body from deformation from one or more directions.

* * * * *